(12) United States Patent
Ikegawa et al.

(10) Patent No.: US 8,987,147 B2
(45) Date of Patent: Mar. 24, 2015

(54) METHOD OF DEPOSITING A FILM USING A TURNTABLE APPARATUS

(71) Applicant: Tokyo Electron Limited, Tokyo (JP)

(72) Inventors: Hiroaki Ikegawa, Yamanashi (JP); Masahiko Kaminishi, Iwate (JP); Kosuke Takahashi, Iwate (JP); Masato Koakutsu, Iwate (JP); Jun Ogawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/108,663

(22) Filed: Dec. 17, 2013

(65) Prior Publication Data

US 2014/0179121 A1   Jun. 26, 2014

(30) Foreign Application Priority Data

Dec. 21, 2012   (JP) .................................. 2012-279921
Nov. 15, 2013   (JP) .................................. 2013-237216

(51) Int. Cl.
| *H01L 21/31* | (2006.01) |
| *H01L 21/469* | (2006.01) |
| *H01L 21/02* | (2006.01) |
| *C23C 16/455* | (2006.01) |
| *C23C 16/458* | (2006.01) |
| *H01L 21/687* | (2006.01) |

(52) U.S. Cl.
CPC ....... *H01L 21/0228* (2013.01); *H01L 21/68764* (2013.01); *H01L 21/02148* (2013.01); *H01L 21/02164* (2013.01); *H01L 21/02178* (2013.01); *H01L 21/02189* (2013.01); *H01L 21/02194* (2013.01); *H01L 21/022* (2013.01); *H01L 21/68771* (2013.01); *C23C 16/45551* (2013.01); *C23C 16/4584* (2013.01)

USPC .......... 438/782; 438/758; 438/761; 438/763; 438/778

(58) Field of Classification Search
None
See application file for complete search history.

(56) References Cited

U.S. PATENT DOCUMENTS

| 8,288,297 | B1 * | 10/2012 | Wang et al. .................... 438/785 |
| 2002/0015852 | A1 * | 2/2002 | Noguchi et al. ............... 428/469 |
| 2005/0161688 | A1 * | 7/2005 | Biwa et al. ...................... 257/94 |
| 2012/0076937 | A1 * | 3/2012 | Kato et al. .................. 427/248.1 |

FOREIGN PATENT DOCUMENTS

JP   4661990   3/2011

* cited by examiner

*Primary Examiner* — Charles Garber
*Assistant Examiner* — Brigitte Paterson
(74) *Attorney, Agent, or Firm* — IPUSA, PLLC

(57) ABSTRACT

A method of depositing a film on substrates using an apparatus including a turntable mounting substrates, first and second process areas above the upper surface of the turntable provided with gas supplying portions, a separation gas supplying portion between the first and second process areas, and a separation area including depositing a first oxide film by rotating the turntable first turns while supplying a first reaction gas, the oxidation gas from the second gas supplying portion, and the separation gas; rotating at least one turn while supplying the separation gas from the first gas supplying portion and the separation gas supplying portion, and the oxidation gas from the second gas supplying portion; and rotating at least second turns to deposit a second oxide film while supplying a second reaction gas from the first gas supplying portion, the oxidation gas from the second gas supplying portion, and the separation gas.

10 Claims, 10 Drawing Sheets

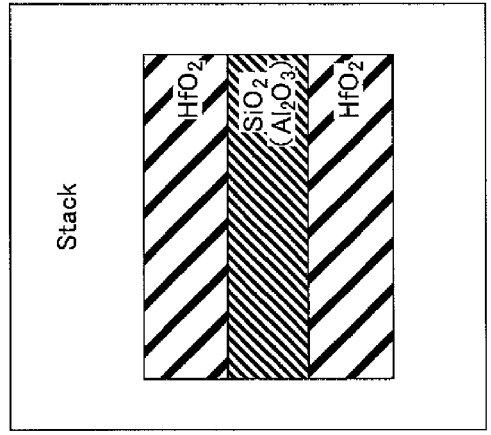
FIG.9A
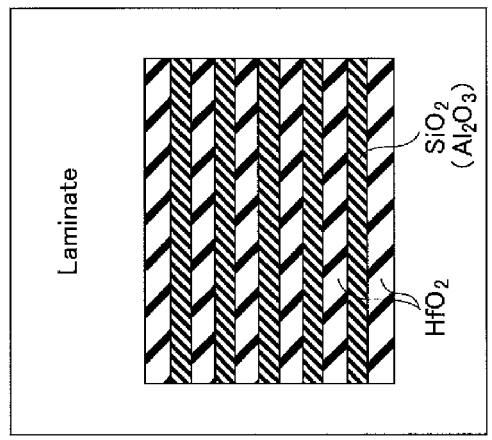
FIG.9B
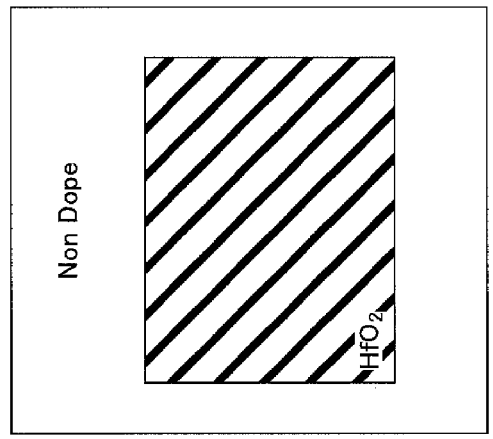
FIG.9C
FIG.9D
|  | Min[%] | Max[%] | [%] | |
|---|---|---|---|---|
| $SiO_2$ | 2 | 50 | 5 | 10 | 15 |
| $Al_2O_3$ | 2 | 50 | 5 | 10 | 15 |

METHOD OF DEPOSITING A FILM USING A TURNTABLE APPARATUS

CROSS-REFERENCE TO RELATED APPLICATIONS

This patent application is based upon and claims the benefit of priority of Japanese Patent Application No. 2012-279921 filed on Dec. 21, 2012 and Japanese Patent Application No. 2013-237216 filed on Nov. 15, 2013 the entire contents of which are incorporated herein by reference.

BACKGROUND OF THE INVENTION

1. Field of the Invention

The present invention generally relates to a method of depositing a film. More specifically, the present invention relates to method of depositing an oxide film or a nitride film containing a first element or a second element.

2. Description of the Related Art

A manufacturing process of a semiconductor integrated circuit (IC) includes a process of depositing a thin film on a semiconductor wafer. In this process, improvement in evenness of a surface of a wafer is required in view of further microminiaturization of an IC. As a method of depositing a film to satisfy this requirement, a method of deposit called an atomic layer deposition (ALD) method or a molecular layer deposition (MLD) method has been considered. According to the ALD method, a cycle, in which one (a reaction gas A) of reaction gases which mutually react is caused to adsorb on the surface of the wafer, and the adsorbing reaction gas A is reacted with the other one (a reaction gas B) of the reaction gases, is repeated to thereby deposit a thin film made of a reaction product on the surface of the wafer. Because the ALD method uses the adsorption of the reaction gas onto the surface of the wafer, the ALD method has an advantage that film thickness evenness and film thickness controllability are excellent.

A turntable-type film deposition apparatus is disclosed in Japanese Patent No. 4661990 as a film deposition apparatus performing the ALD method. This film deposition apparatus is rotatable and is positioned in a vacuum chamber. This film deposition apparatus includes a turntable, which is rotatable and is positioned in a vacuum chamber, and on which a plurality of wafers are mounted, a separating area that is laid out above the turntable and separates a gas supplying area for the reaction gas A from a gas supplying area for the reaction gas B, evacuation ports corresponding to the gas supplying areas where the reaction gas A and the reaction gas B are supplied, and an evacuation device connected to these evacuation ports. In this film deposition apparatus, the wafers pass through the gas supplying area for the reaction gas A, the separating area, the gas supplying area for the reaction gas B, and the separating area along rotation of the turntable. With this, the reaction gas A adsorbs onto the surface of the wafer in the gas supplying area for the reaction gas A, and the reaction gas A reacts with the reaction gas B in the gas supplying area for the reaction gas B. Therefore, it is not necessary to change the reaction gas A to the reaction gas B while depositing the film, and the reaction gases A and B can be continuously supplied. Therefore, there is an advantage that an evacuation/purge process is unnecessary thereby shorting a time period for depositing the film.

In a case where an oxide film containing a predetermined element is deposited using the above turntable-type film deposition apparatus, by using the reaction gas A being a reaction gas containing the above predetermined element such as a silicon gas containing silicon and the reaction gas B being an oxide gas such as ozone, an oxide film containing a predetermined element can be formed. In this case, a gas containing the predetermined element adsorbs firstly onto the surface of the wafer, an oxidation gas (the reaction gas B) is supplied onto the surface of the wafer, and the reaction gas A and the reaction gas B react thereby depositing a molecular layer containing the predetermined element. As described, the reaction gas containing the predetermined element adsorbs firstly onto the surface of the wafer and reacts with the oxidation gas on the surface of the wafer. Thus, the oxide film containing the predetermined element is deposited on the surface of the wafer.

According to the method of depositing the film, in a case where oxide films containing different types of elements are deposited and laminated to form a laminate structure, the above film deposition processes of depositing the oxide films are repeated. For example, it becomes possible to deposit an oxide film having a laminate structure including ZrAlO, HfAlO, and HfSiO.

SUMMARY OF THE INVENTION

Accordingly, embodiments of the present invention may provide a novel and useful method of depositing a film.

According to an aspect of the present invention, there is provided a method of depositing a film of forming an oxide film containing a predetermined first element and a predetermined second element on a plurality of substrates using a film deposition apparatus including a turntable that is accommodated in a chamber, is rotatable, and includes mounting portions formed on an upper surface of the turntable so that the substrates are mounted on the mounting portions, a first process area laid out above the upper surface of the turntable and being provided with a first gas supplying portion, which supplies gases toward the upper surface of the turntable, a second process area arranged apart from the first process area along a peripheral direction of the turntable and being provided with a second gas supplying portion, which supplies the gases toward the upper surface of the turntable, a separation gas supplying portion provided between the first process area and the second process area and supplying a separation gas onto the upper surface of the turntable, and a separation area including a ceiling surface forming a narrow space so that the narrow space for introducing the separation gas supplied from the separation gas supplying portion to the first process area and the second process area is formed between the ceiling surface and the surface of the turntable, the method of depositing the film including a first process of rotating the turntable at least one turn while the separation gas is supplied from the first gas supplying portion and the separation gas supplying portion, and an oxidation gas is supplied from the second gas supplying portion; a second process of depositing a first oxide film containing the first element onto the substrates by rotating the turntable a first predetermined number of turns while a first reaction gas containing the first element is supplied from the first gas supplying portion, the oxidation gas is supplied from the second gas supplying portion, and the separation gas is supplied from the separation gas supplying portion; a third process of rotating the turntable at least one turn under a state where the separation gas is supplied from the first gas supplying portion and the separation gas supplying portion, and the oxidation gas is supplied from the second gas supplying portion; and a fourth process of rotating the turntable at least a second predetermined number of turns in order to deposit a second oxide film containing the second element on the substrates under a state where a second reaction gas containing the second element is supplied from the first gas supplying portion, the oxidation gas is supplied from the second gas supplying portion, and the separation gas is supplied from the separation gas supplying portion.

According to another aspect of the present invention, there is provided a method of depositing a film of forming a nitride film containing a predetermined first element and a predetermined second element on a plurality of substrates using a film deposition apparatus including a turntable that is accommodated in a chamber, is rotatable, and includes mounting portions formed on an upper surface of the turntable so that the substrates are mounted on the mounting portions, a first process area laid out above the upper surface of the turntable and being provided with a first gas supplying portion, which supplies gases toward the upper surface of the turntable, a second process area arranged apart from the first process area along a peripheral direction of the turntable and being provided with a second gas supplying portion, which supplies the gases toward the upper surface of the turntable, a separation gas supplying portion provided between the first process area and the second process area and supplying a separation gas onto the upper surface of the turntable, and a separation area including a ceiling surface forming a narrow space so that the narrow space for introducing the separation gas supplied from the separation gas supplying portion to the first process area and the second process area is farmed between the ceiling surface and the surface of the turntable, the method of depositing the film including a first process of rotating the turntable at least one turn while the separation gas is supplied from the first gas supplying portion and the separation gas supplying portion, and a nitriding gas is supplied from the second gas supplying portion; a second process of depositing a first nitride film containing the first element onto the substrates by rotating the turntable a first predetermined number of turns while a first reaction gas containing the first element is supplied from the first gas supplying portion, the nitriding gas is supplied from the second gas supplying portion, and the separation gas is supplied from the separation gas supplying portion; a third process of rotating the turntable at least at least one turn under a state where the separation gas is supplied from the first gas supplying portion and the separation gas supplying portion, and the nitriding gas is supplied from the second gas supplying portion; and a fourth process of rotating the turntable at least a second predetermined number of turns in order to deposit a second nitride film containing the second element on the substrates under a state where a second reaction gas containing the second element is supplied from the first gas supplying portion, the nitriding gas is supplied from the second gas supplying portion, and the separation gas is supplied from the separation gas supplying portion.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 9A illustrates a single film made of hafnium oxide as a comparative example;

FIG. 9B illustrates an exemplary HfSiO film having a laminated structure of the second embodiment;

FIG. 9C illustrates an exemplary HfSiO film of a stack type;

FIG. 9D illustrates ratios between an SiO film and an AlO film included on a HfSiO film and a HfAlO film, which are obtained by the method of depositing the film of the second embodiment.

DETAILED DESCRIPTION OF EMBODIMENTS

In a case where the above-described oxide film is deposited onto a plurality of wafers using the above turntable-type film deposition apparatus, when the reaction gas A (a raw gas) and the reaction gas B (an oxidation gas) simultaneously stop being supplied, there is produced a wafer, which is supplied with only the reaction gas A and has the adsorbing reaction gas A after an incompletely finished film deposition process, and another wafer, which is supplied with not only the reaction gas A but also the reaction gas B and deposited with the oxide film after a completely finished film deposition process. For example, the reaction gas A is a tetrakis(ethylmethylamino)zirconium (TEMAZ) gas being a type of an organometallic gas containing Zr and the reaction gas B is a $O_3$ gas and a film deposition process is performed to deposit a zirconium oxide (ZrO) film, a wafer onto which only the TEMAZ gas adsorbs and another wafer supplied with the $O_3$ gas and deposited with the ZrO film are produced.

Thereafter, if a film deposition process is performed to deposit an aluminum oxide (AlO) film so as to have the above-described laminate structure using a trimethylaluminum (TMA) gas, being one kind of an organometallic gas containing Al, as the reaction gas A and a $O_3$ gas as the reaction gas B, the TMA gas does not adsorb onto the wafer, onto which only the TEMAZ gas adsorbs. Thus, there is a problem that a wafer, onto which the laminate structure cannot be deposited, is produced. Said differently, there is a characteristic where the adsorption is not properly performed in the film deposition process when the raw gases directly contact. Therefore, there is a problem that the above-described incomplete wafer may be produced in the above film deposition process.

This problem may occur in a laminate structure including other types of oxide films. Further, this problem may occur in a laminate structure including nitride films.

A description is given below, with reference to the figures of the embodiments of the present invention.

In The Embodiments Described Below, the Reference Symbols Typically Designate as Follows:
1: chamber;
2: turntable;
4: convex portion;
11: ceiling plate;
12: chamber body;
15: transfer opening;
24: circular concave portion (wafer mounting portion);
31,32: reaction gas nozzle;
41, 42: separation gas nozzle;
D: separating area;
P1: first process area;
P2: second process area;
H: separation space; and
W: wafer.

In the above-mentioned figures, the same or corresponding reference symbols are attached to the same or corresponding members and parts, and description of overlapping explanation is omitted. Further, in the figures, relative ratios among the members and the parts are not intended to illustrate. Therefore, dimensions are to be practically determined by a person ordinarily skilled in art in light of the following non-limiting embodiment.

First Embodiment (Film Deposition Apparatus)

Figure 1:
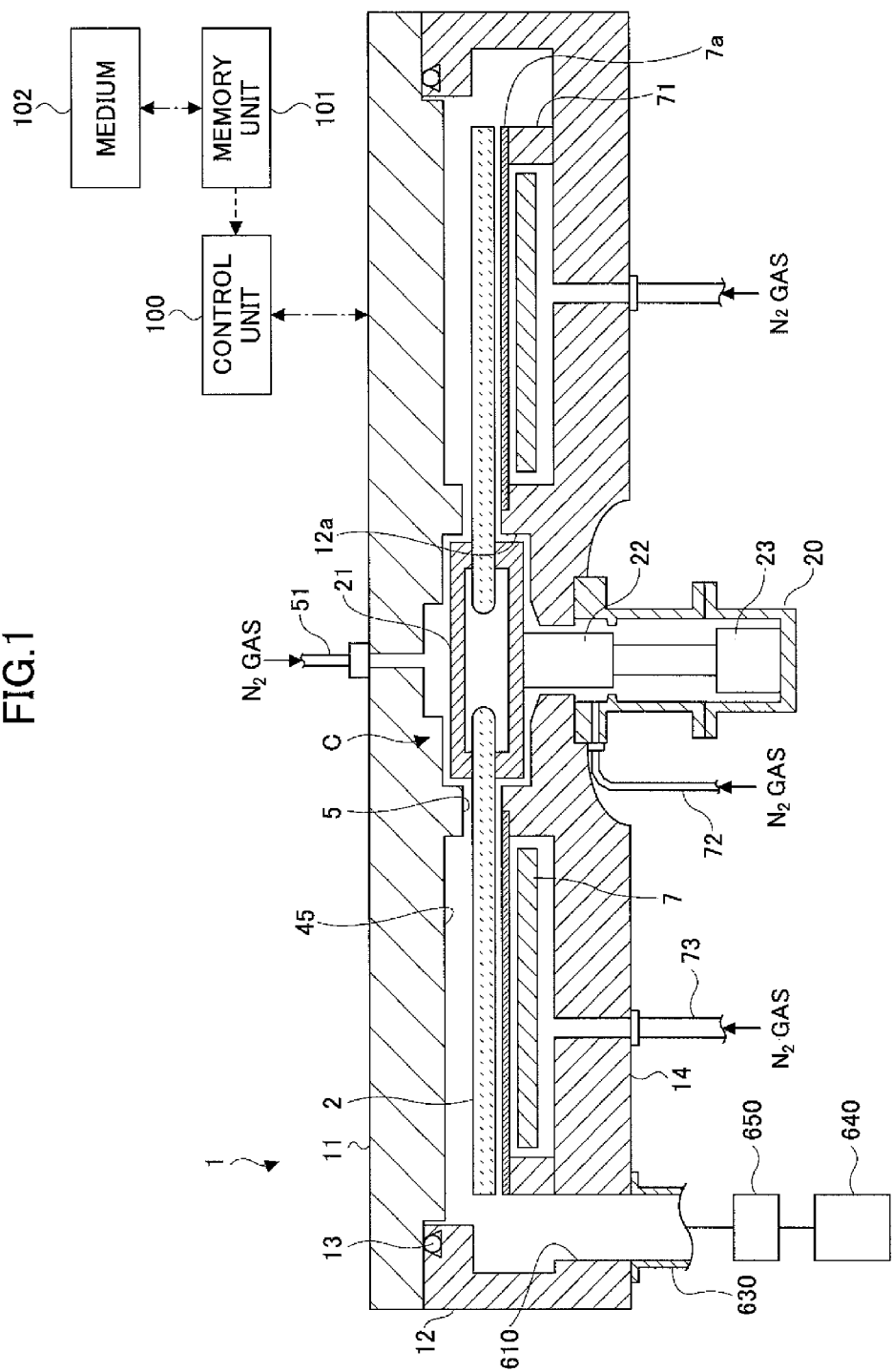
FIG. 1 is a cross-sectional view for illustrating a film deposition apparatus preferable for performing a method of depositing a film of an embodiment of the present invention.
Figure 2:
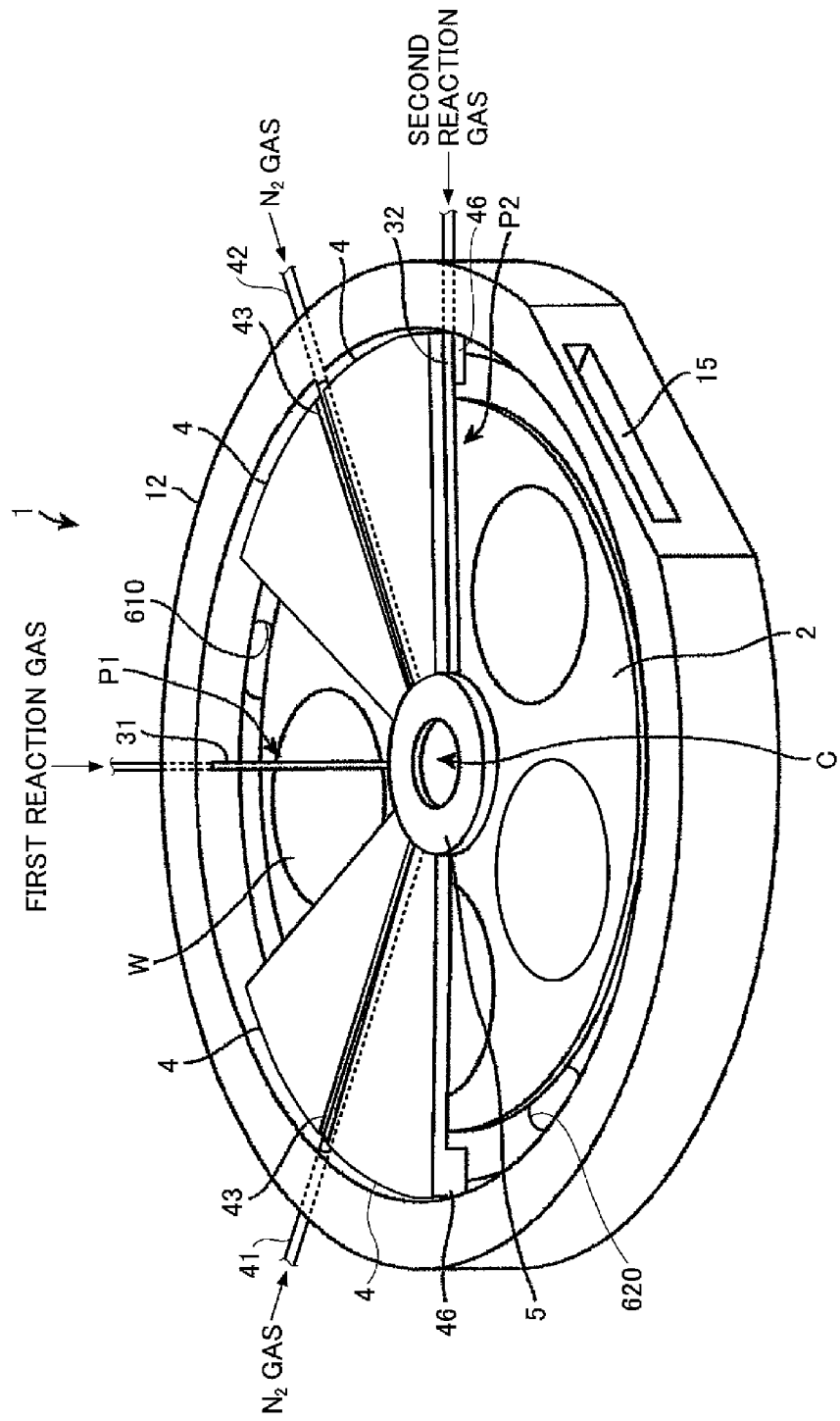
FIG. 2 is a perspective view for illustrating a structure inside a vacuum chamber of the film deposition apparatus illustrated in FIG. 1.
Figure 3:
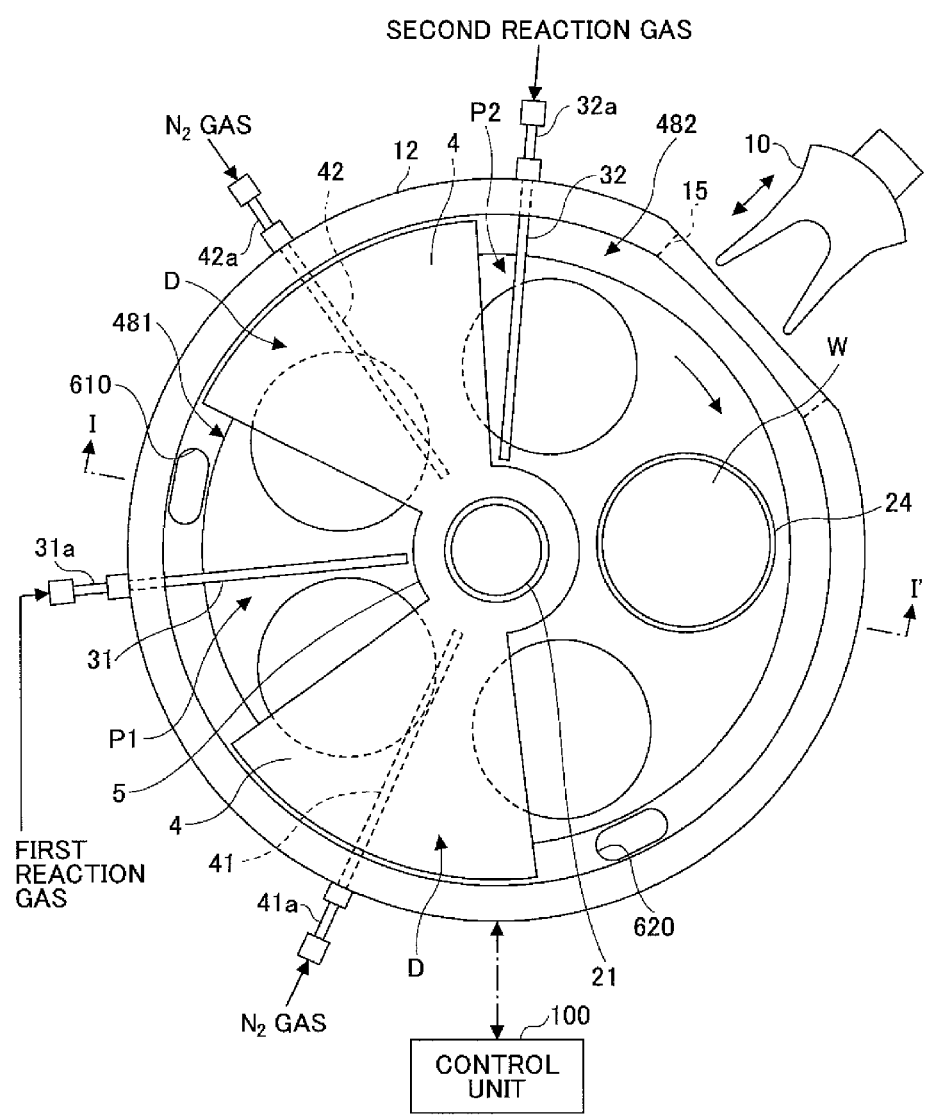
FIG. 3 is a schematic plan view for illustrating a structure inside the vacuum chamber of the film deposition apparatus illustrated in FIG. 1.

At first, referring to FIGS. 1 to 3, a film deposition apparatus suitable for performing a method of depositing a film of the first embodiment is described.

FIG. 1 is a cross-sectional view for illustrating a film deposition apparatus preferable for performing a method of depositing a film of an embodiment of the present invention. FIG. 2 is a perspective view for illustrating a structure inside a vacuum chamber of the film deposition apparatus illustrated in FIG. 1. FIG. 3 is a schematic plan view for illustrating a structure inside the vacuum chamber of the film deposition apparatus illustrated in FIG. 1.

Referring to FIGS. 1 to 3, the film deposition apparatus of the embodiment includes a chamber 1 having a substantially circular shape in its plan view and a flattened shape in its side view, and a turntable 2 having its rotational center in the center of the chamber 1. Referring to FIG. 1, the chamber 1 includes a chamber body 12 having a bottomed cylindrical shape, and a ceiling plate 11, which is detachably provided onto the upper surface of the chamber body 12 through a sealing member 13 (see FIG. 1) such as an O-ring to hermetically seal the chamber 1.

The turntable 2 is fixed by a core portion 21 in a cylindrical shape at the center portion of the turntable 2. The core unit 21 is fixed to the upper end of the rotational shaft 22 extending in the vertical direction. The rotational shaft 22 penetrates a bottom portion 14 of the chamber 1. The lower end of the rotational shaft 22 is attached to a driving mechanism 23, which causes the rotational shaft 22 (see FIG. 1) to rotate around the vertical axis of the rotational shaft 22. The rotational shaft 22 and the driving mechanism 23 are accommodated in a cylindrical case body 20 whose upper surface is opened. A flange on the upper surface of the case body 20 is hermetically attached to the lower surface of a bottom portion 14 of the chamber 1 to isolate the inner atmosphere from the outer atmosphere of the case body 20 and to maintain a gastight state between the inner atmosphere and the outer atmosphere of the case body 20.

An evacuation pipe 630 communicating with an evacuation pipe 630 is provided in an outer edge portion inside the chamber 1. The evacuation pipe 630 is connected to a vacuum pump 640 through a pressure adjuster 650 so that a gas is evacuated from the inside of the chamber 1 through the evacuation port 610.

Referring to FIG. 2 and FIG. 3, circular concave portions 24 for receiving a plurality of semiconductor wafers (hereinafter, referred to as a "wafer", and 5 wafers are illustrated in FIGS. 2 and 3) are provided on a surface of the turntable 2 along a rotational direction (a peripheral direction) of the turntable 2. FIG. 3 illustrates a state where the wafer W is mounted in only one circular concave portion 24 for convenience. The inner diameter of the circular concave portion 24 is slightly greater than the diameter (for example, 300 mm) of the wafer W by, for example, 2 mm. The depth of the circular concave portion 24 is substantially equal to the thickness of the wafer W. Therefore, when the wafer W is accommodated in the circular concave portion 24, the height of the surface of the wafer W is substantially the same as the height of the surface of the turntable 2 in an area where the wafer W is not mounted.

FIGS. 2 and 3 illustrate the structure inside the chamber 1. For convenience, the ceiling plate 11 is omitted from illustration in FIGS. 2 and 3. Referring to FIGS. 2 and 3, a reaction gas nozzle 31, a reaction gas nozzle 32, and separation gas nozzles 41 and 42, each made of, for example, quartz, are arranged above the turntable 2. In FIGS. 2 and 3, the separation gas nozzle 41, the reaction gas nozzle 31, the separation gas nozzle 42, and the reaction gas nozzle 32 are sequentially arranged in a clockwise direction (the rotational direction of the turntable 2) from the transfer opening 15 (described below) at intervals in the peripheral direction of the chamber 1. These nozzles 31, 32, 41, and 42 are attached to the chamber body 12 by fixing gas introducing ports 31a, 32a, 41a, and 42a (see FIG. 3), which are root portions of the nozzles 31, 32, 41, and 42, respectively, to the outer peripheral wall of the chamber 1 so as to extend along radii of the chamber body 12 in parallel to the turntable 2.

A first reaction gas supplying source storing the first reaction gas is connected to the reaction gas nozzle 31 through an on-off valve (not illustrated) and a flow rate adjuster (not illustrated). A second reaction gas supplying source storing the second reaction gas is connected to the reaction gas nozzle 32 (not illustrated) through an on-off valve and a flow rate adjuster (not illustrated).

The first reaction gas is preferably a gas, which contains a metal element or a semiconductor element, and is selected so as to be used as an oxide film or a nitride film when the gas is changed to oxide or nitride. The second reaction gas is selected as an oxidation gas or a nitriding gas, with which a metal element or a semiconductor element reacts to produce metal oxide, metal nitride, semiconductor oxide, or semiconductor nitride. Specifically, the first reaction gas is preferably an organometallic gas (or a semiconductor gas) containing a metal element (or a semiconductor element). Further, the first reaction gas is preferably a gas having adsorptive property for the surface of the wafer W. The second reaction gas is preferably an oxidation gas or a nitriding gas, which can react with the first reaction gas adsorbed on the surface of the wafer 100 and whose reaction compound can be deposited on the surface of the wafer W.

Specifically, the first reaction gas is, for example, a reaction gas containing hafnium element such as tetrakis(dimethylamino)hafnium (hereinafter, referred to as "TDMAH") provided to form hafnium oxide (generally referred to as "HfO" and may contain $HfO_2$) as the oxide film, a reaction gas containing titanium element as the oxide film, or $TiCl_4$ or the like for forming TiN as the nitride film. The second reaction gas may be, for example, an ozone ($O_3$) gas as the oxidation gas or an ammonia ($NH_3$) gas as the nitriding gas.

A gas supplying source for supplying an inert gas such as a rare gas like Ar or He or a nitrogen ($N_2$) gas is connected to the separation gas nozzles 41 and 42 through an on-off valve (not illustrated) or a flow rate adjuster (not illustrated). A $N_2$ gas is used as the inert gas in the embodiment.

Figure 4:
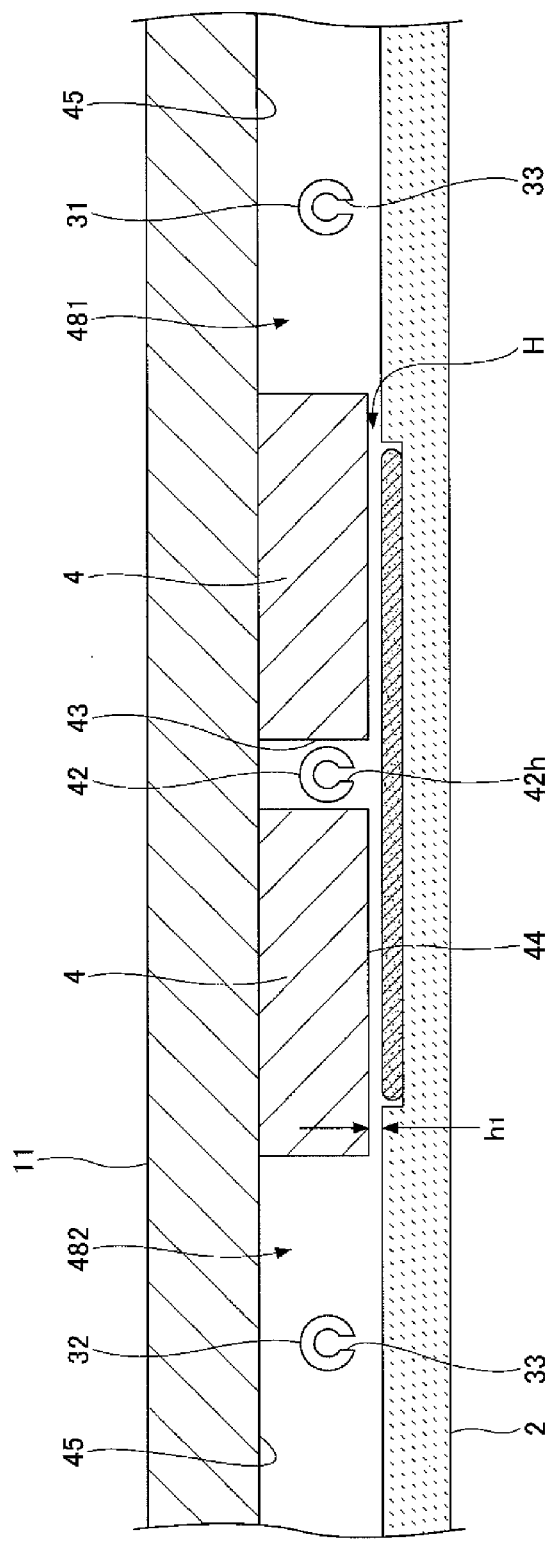
FIG. 4 is a cross-sectional view of a part of the film deposition apparatus, which includes a reaction gas nozzle and a separation gas nozzle and is illustrated in FIG. 1.

FIG. 4 is a cross-sectional view of a part of the film deposition apparatus, which includes the reaction gas nozzles 31 and 32 and the separation gas nozzle and is illustrated in FIG. 1. As illustrated in FIG. 4, a plurality of gas ejection holes 33 opening downward toward the turntable 2 are arranged in the reaction gas nozzles 31 and 32 along the longitudinal direction of the reaction gas nozzles 31 and 32 at intervals of, for example, 10 mm. As illustrated in FIG. 3, a lower area of the reaction gas nozzle 31 is a first process area P1 for causing the first reaction gas to adsorb onto the wafer W. The lower area of the reaction gas nozzle 32 is a second process area P2 where the first reaction gas adsorbed onto the wafer W in the first process area P1 is oxidized or nitrided. Lower areas of the separation gas nozzles 41 and 42 are separating areas D for separating the first process area P1 from the second process area P2 to prevent the first reaction gas and the second reaction gas from mixing.

Referring to FIGS. 2 and 3, two convex portions 4 are provided inside the chamber 1. The convex portions 4 have a substantially sector form in its plan view with its apex cut in a circular arc shape. Within this embodiment, an inner circular arc is connected to a ring-shaped protruding portion (described later), and an outer circular arc is arranged along an inner peripheral surface of the chamber body 12 of the chamber 1.

FIG. 4 is a cross-sectional view of the chamber 1 along a concentric circle of the turntable 2 from the reaction gas nozzle 31 to the reaction gas nozzle 32. As illustrated in FIG. 4, the convex portion 4 is attached to the back surface of the ceiling plate 11. Therefore, a flat and low ceiling surface 44 (a first ceiling surface) being a lower surface of the convex portion 4 and a high ceiling surface 45 (a second ceiling surface), which is positioned on both sides of the ceiling surface 44 and higher than the ceiling surface 44 exist inside the chamber 1.

Further, as illustrated in FIG. 4, a groove 43 is formed in the center in the peripheral direction of the convex portion 4 and extends along a radius direction of the turntable 2. The separation gas nozzle 42 is accommodated in the groove 43. Another groove 43 is similarly formed in another convex portion 4. The separation gas nozzle 41 is accommodated in the other groove portion 43. Referring to FIG. 4, a gas ejection hole 42h formed in the separation gas nozzle 42 is illustrated. A plurality of gas ejection holes 42h are formed along the longitudinal direction of the separation gas nozzle 42 at predetermined intervals (for example, 10 mm). An opening diameter of the gas ejection hole is, for example, 0.3 mm to 1.0 mm. Although it is omitted from the illustration, gas ejection holes are formed in the separation gas nozzle 41 in a manner similar thereto.

The reaction gas nozzles 31 and 32 are provided in spaces lower than the high ceiling surface 45. The reaction gas nozzles 31 and 32 are provided in the vicinity of the wafer W and apart from the ceiling surface 45. For convenience of explanation, the lower space of the ceiling surface 45 where the reaction gas nozzle 31 is provided is called a space 481, and the lower space of the ceiling surface 45 where the reaction gas nozzle 32 is provided is called a space 482.

A separation space H, which is narrow, is formed between the low ceiling surface 44 and the turntable 2. When the $N_2$ gas is supplied from the separation gas nozzle 42, the $N_2$ gas flows toward the spaces 481 and 482 through the separation space H. At this time, the volume of the separation space H is smaller than the volumes of the spaces 481 and 482. Therefore, the pressure of the separation space H can be set relatively higher than the pressures in the spaces 481 and 482 by the $N_2$ gas. Said differently, the separation space H provides a pressure barrier between the spaces 481 and 482. Further, the $N_2$ gas flowing from the separation space H to the spaces 481 and 482 works as counter flows against the first reaction gas from the first process area P1 and the second reaction gas (the oxidation gas or the nitriding gas) from the second process area P2. Therefore, the first reaction gas from the first process area P1 and the second reaction gas from the second process area P2 are separated by the separation space H. Therefore, it is possible to prevent mixture and reaction of the first reaction gas and the oxidation gas or the nitriding gas in the chamber 1.

It is preferable to set the height h1 of the ceiling surface 44 relative to the upper surface of the turntable 2 suitable for increasing the pressure in the separation space H higher than the pressures in the spaces 481 and 482 in consideration of the pressure inside the chamber 1 at the time of depositing the film, the rotational speed of the turntable 2, the supply amount of the separation gas (the $N_2$ gas), or the like.

As illustrated in FIGS. 1 to 3, the ring-shaped protruding portion 5 surrounding the outer periphery of the core portion 21, to which the turntable 2 is fixed, is provided under the lower surface of the ceiling plate 11. The ring-shaped protruding portion 5 is continuously formed from the convex portions 4 at portions on a side of the rotation center of the convex portions 4. The lower surface of the ring-shaped protruding portion 5 has substantially the same height as that of the ceiling surface 44.

Figure 5:
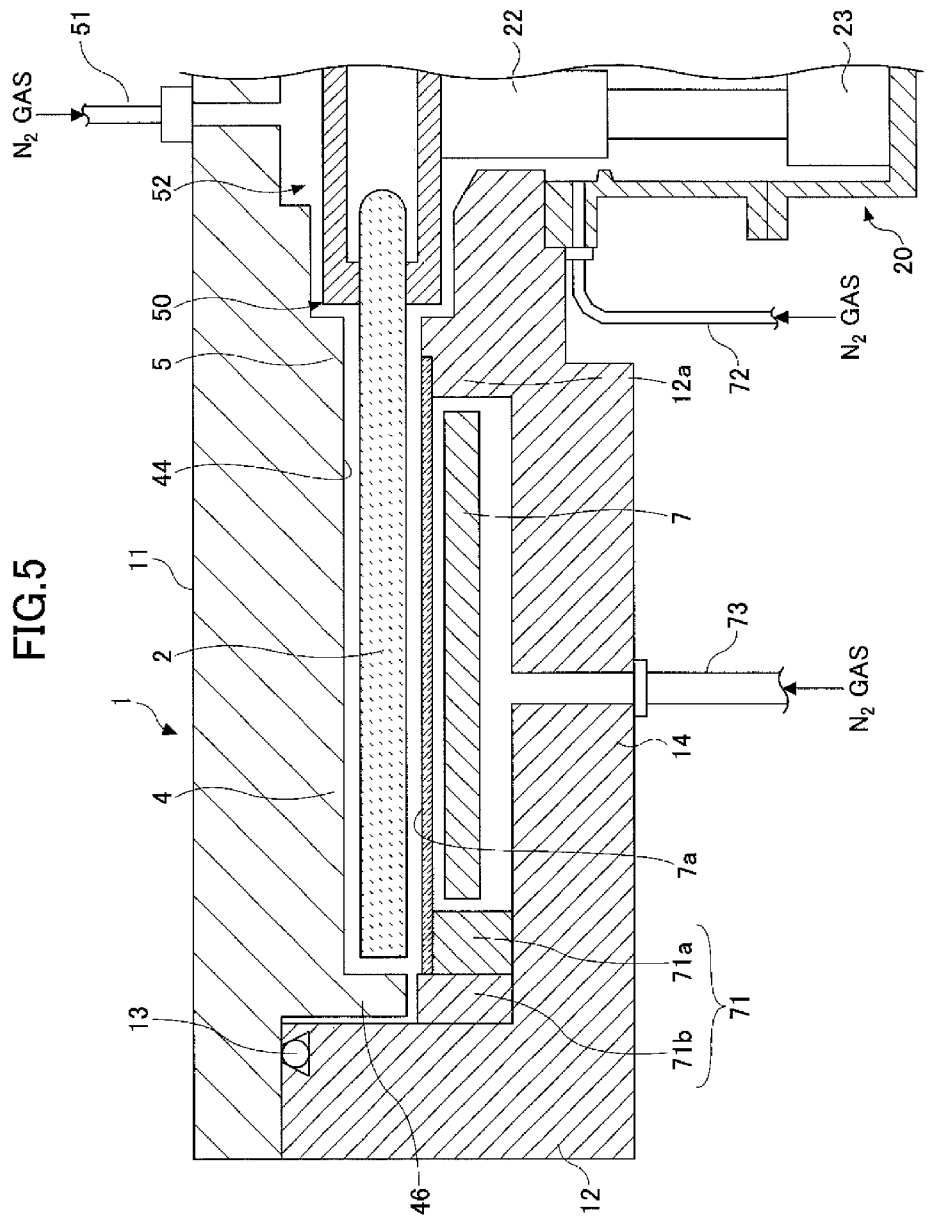
FIG. 5 is a cross-sectional view of another part of the film deposition apparatus, which includes a ceiling surface and is illustrated in FIG. 1.

FIG. 1 is a cross-sectional view taken along a line I-I' of FIG. 3. Referring to FIG. 3, an area provided with the ceiling surface 45 is provided is illustrated. Meanwhile, FIG. 5 illustrates a cross-sectional view of a part of the area where the ceiling surface is provided. As illustrated in FIG. 5, a peripheral edge portion (a portion of the chamber 1 on the outer edge side) of the convex portion 4 in a substantially sector form has a bent portion 46 bent in a L-like shape so as to face the outer end surface of the turntable 2. The bent portion 46 prevents communication of the gas between the space 481 and the space 482 through a space between the turntable 2 and the inner peripheral surface of the chamber body 12. The convex portion 4 in the substantially sector form is provided in the ceiling plate 11. Because the ceiling plate 11 is detachable from the chamber body 12, there is a small gap between the outer peripheral surface of the bent portion 46 and the chamber body 12. A gap between the inner peripheral surface of the bent portion 46 and the outer edge surface of the turntable 2 and a gap between the outer peripheral surface of the bent portion 46 and the chamber body 12 are set to have a dimension similar to, for example, that of a gap between the ceiling surface 44 and the upper surface of the turntable 2.

Referring again to FIG. 3, the first evacuation port 61 communicating with the space 481 and a second evacuation port 62 communicating with the space 482 are formed between the turntable 2 and the inner peripheral surface of the chamber body. Referring to FIG. 1, the first and second evacuation ports 610 and 620 are connected to, for example, a vacuum pump 640 being an evacuating means through evacuation pipes 630.

As illustrated in FIGS. 1 and 5, a heater unit 7 being a heating means is provided in a space between the turntable 2 and the bottom portion 14 of the chamber 1. The wafer W on the turntable 2 is heated through the turntable 2 to have a temperature determined in a process recipe (for example, 450° C.). A ring-like cover member 71 is provided on the lower side of the periphery of the turntable 2 to prevent the gas from intruding into the space below the turntable 2. The cover member 71 includes an inner member 71a provided in a position vertically corresponding to the outer edge portion of the turntable 2 and to an outer peripheral side outer than the outer edge portion of the turntable 2, and an outer member 71b provided between the inner member 71a and the inner wall surface of the chamber 1. The outer member 71b is provided in the vicinity of the bent portion 46 formed on the outer edge portion of the convex portion 4 under the bent portion 46. The inner member 71a surrounds the entire periphery of the heater unit 7 and is positioned under the outer edge portion and a portion slightly outer than the outer edge portion of the turntable 2.

A part of the bottom portion 14 closer to the rotation center than the space where the heater unit 7 is arranged has a ring-shaped protruding portion 12a protruding upward so as to approach the core portion 21, which is provided in the vicinity of the center portion of the lower surface of the turntable 2. A narrow space is formed between the ring-shaped protruding portion 12a and the core portion 21. Further, there is a narrow gap between the inner peripheral surface of the through hole for the rotational shaft 22 penetrating through the bottom portion 14 and the rotational shaft 22. The narrow space communicates with the case body 20. A purge gas supplying pipe 72 is provided in the case body 20 so that the $N_2$ gas being the purge gas is supplied into the narrow space to purge the narrow space. In the bottom portion 14 of the chamber 1, a plurality of purge gas supplying pipes 73 are provided to purge a space where the heater unit 7 is arranged under the heater unit 7 at intervals of a predetermined angle in the peripheral direction (only one purge gas supplying pipe 73 is illustrated in FIG. 5). Further, a lid member 7a is provided between the heater unit 7 and the turntable 2. The lid member 7a prevents the gas from intruding into an area where the heater unit 7 is installed by covering an area between the inner peripheral wall of the outer member 71b (the upper surface of the inner member 71a) and the upper end portion of the ring-shaped protruding portion 12a along the peripheral direction. The lid member 7a is made of, for example, quartz.

When the $N_2$ gas is supplied from the purge gas supplying pipe 72, the $N_2$ gas flows through a gap between the inner peripheral surface of the through hole for the rotational shaft 22 and the rotational shaft 22, a gap between the ring-shaped protruding portion 12a and the core portion 21, and a space between the turntable 2 and the lid member 7a, and is evacuated from the first evacuation port 610 or the second evacuation port 620 (FIG. 3). Further, when the $N_2$ gas is supplied from the purge gas supplying pipe 73, the $N_2$ gas flows from the space where the heater unit 7 is accommodated out of the a gap (not illustrated) between the lid member 7a and the inner member 71a, and is evacuated from the first evacuation port 610 or the second evacuation port 620 (FIG. 3). By these flows of the $N_2$ gas, it is possible to prevent the gases inside the spaces 481 and 482 from mixing by the gases passing through a space at a center lower space of the chamber 1 and a lower space of the turntable 2.

A separation gas supplying pipe 51 is connected to a center portion of the ceiling plate 11 of the chamber 1. The separation gas being the $N_2$ gas is supplied to a space 52 between the ceiling plate 11 and the core portion 21. The separation gas supplied to the space 52 is discharged toward the periphery of the turntable 2 along the surface on the side of a wafer mounting area of the turntable 2 through a space (a narrow gap) 50 between the ring-shaped protruding portion 5 and the turntable 2. The space 50 is maintained to have a pressure higher than those of the spaces 481 and 482 by the separation gas. Therefore, it is possible to prevent the first reaction gas supplied to the first process area P1 and the second reaction gas supplied to the second process area P2 from mixing after passing through the center area C. Said differently, the space 50 (or the center area C) functions in a manner similar to the separation space H (or the separating area D).

As illustrated in FIGS. 2 and 3, a transfer opening 15 is formed in the side wall of the chamber 1 for serving and receiving the wafer W being the substrate between a transfer arm 10 provided outside the chamber 1 and the turntable 2. The transfer opening 15 is opened and closed by a gate valve (not illustrated). Further, lift pins (not illustrated) for lifting the wafers from these back surfaces and a lifting mechanism (not illustrated) are provided in the circular concave portions 24 being the wafer mounting area of the turntable 2. The wafers W are served and received at a position corresponding to the transfer opening 15. Therefore, the lift pins penetrate the circular concave portions 24 from a lower surface of the turntable 2 to bring the wafers W to the position where the wafers W are served and received with the transfer arm 10.

Further, as illustrated in FIG. 1, the film deposition apparatus of the embodiment includes a control unit 100 including a computer for controlling operations of the entire film deposition apparatus. A memory of the control unit 100 stores a program causing the film deposition apparatus to perform a method of depositing a film described below under a control of the control unit 100. This program includes groups of steps for performing the method of depositing the film as described below and is stored in a medium 102 such as a hard disk, a compact disk, a magnet-optical disk, a memory card, a flexible disk, or the like. The program is read in a memory unit 101 by a predetermined reading device and is installed inside the control unit 100.

(Method of Depositing Film)

Next, a method of depositing a film of the first embodiment of the present invention using the film deposition apparatus described in FIGS. 1 to 5 is described.

Figure 6:
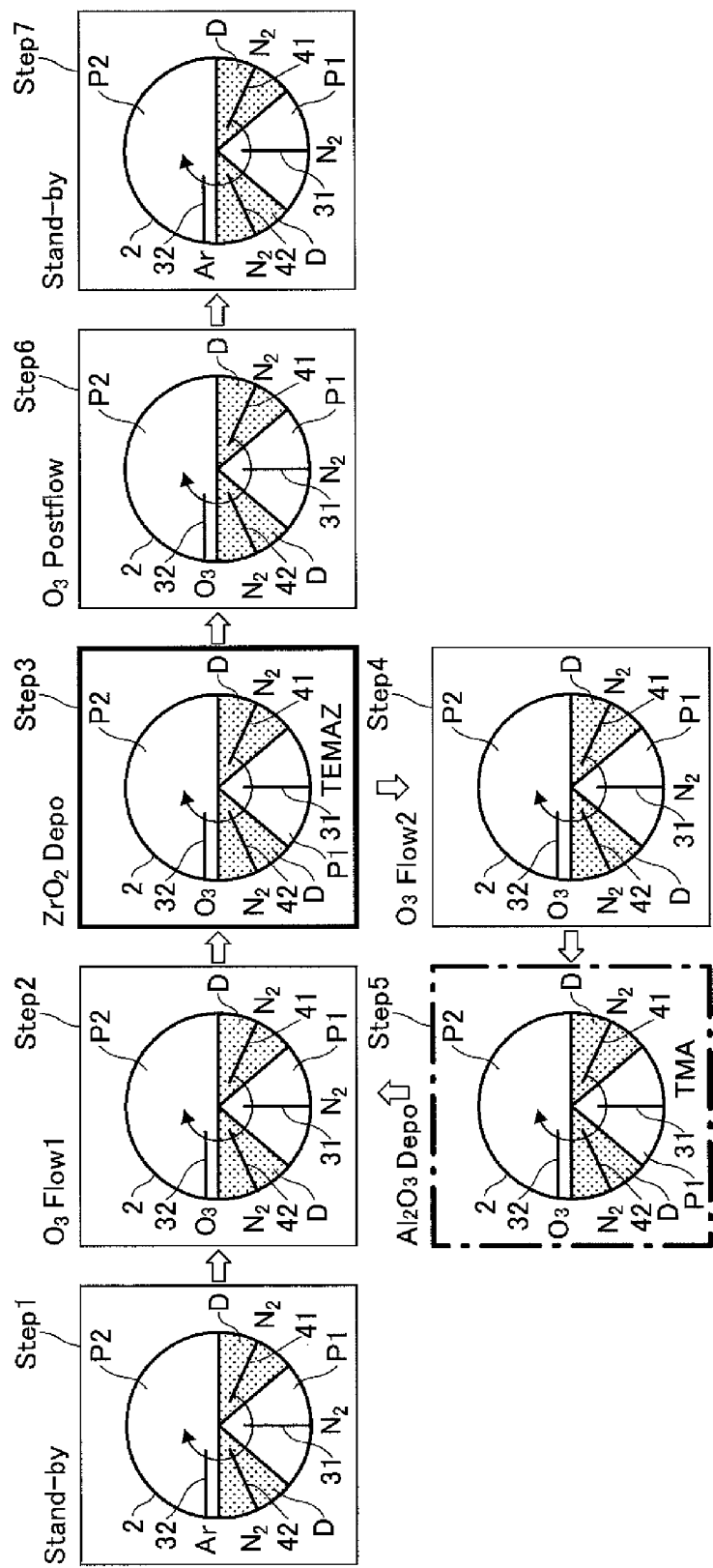
FIG. 6 is a sequential diagram illustrating an exemplary sequence of a method of depositing the film of a first embodiment using a turntable.

FIG. 6 is a sequential diagram illustrating an example of the method of depositing the film of the first embodiment of the present invention. Referring to FIG. 6, the turntable 2, the first process area P1 and the reaction gas nozzle 31, the second process area P2 and the reaction gas nozzle 32, and the separating area D and the separation gas nozzles 41 and 42 are simply illustrated. The method of depositing the film of the first embodiment is explained using an example of a process of forming an oxide film by depositing an ZrAlO film. The ZrAlO film has an actual laminate structure formed by laminating a $ZrO_3$ film and an $Al_2O_3$ film. Further, ZrAlO has a high electric permittivity such as a high-k film.

Before performing the film deposition process illustrated in FIG. 6, it is necessary that the wafer W is transferred into the chamber 1 and mounted an the turntable 2. For this, at first, a gate valve (not illustrated) is opened. The wafer W is served into the circular concave portion 24 of the turntable 2 through the transfer opening 15 (FIG. 3) by the transfer arm 10 (FIG. 3). When the circular concave portion 24 is stopped at a position facing the transfer port 15, the lift pin (not illustrated)

lifts up or down from the bottom portion side of the chamber 1 through the through hole in the bottom surface of the circular concave portion 24 to serve or receive the wafer W. The wafer W is served and received while the turntable 2 is intermittently rotated to thereby mount the wafers W inside the circular concave portions 24 equal to 5.

Subsequently, the gate valve is closed, and the chamber 1 is evacuated by the vacuum pump 640 to have a minimum degree of vacuum. From this state, the film deposition process illustrated in FIG. 6 is performed as follows.

Referring to FIG. 1, a stand-by process is performed in step 1. In the stand-by process, the $N_2$ gas being a separation gas is discharged from the separation gas nozzles 41 and 42 at a predetermined flow rate, and the $N_2$ gas is discharged from the separation gas supplying pipe 51 and the purge gas supplying pipes 72, 72 at a predetermined flow rate (see FIG. 1). The $N_2$ gas is discharged from the reaction gas nozzle 31 at a predetermined flow rate, and the Ar gas is discharged from the reaction gas nozzle 32 at a predetermined flow rate. The Ar gas is a rare gas and one type of the inert gas. Although the $N_2$ gas is not a rare gas, the $N_2$ gas is one type of the inert gas. Resultantly, the inert gases are discharged from all nozzles 31, 32, 41, and 42. Therefore, the atmosphere inside the chamber 1 becomes an atmosphere of the inert gas. At this time, the pressure adjuster 650 adjusts the inside of the chamber 1 to have a predetermined process pressure. Subsequently, the wafer W is heated to be, for example, a range of 50° C. to 600° C. by the heater unit 7 while the turntable 2 is rotated at a predetermined rotational speed in a clockwise direction. With this, the stand-by state where the film deposition process is ready is prepared. The rotational speed of the turntable 2 is variable in a range of, for example, 1 rpm to 240 rpm depending on the intended use. However, in the method of depositing the film of the first embodiment, an example that the turntable 2 is rotated at the rotational speed of 6 rpm is explained.

Within the first embodiment, although the N2 gas is purged from the separation gas nozzles 41, 42 and the reaction gas nozzle 31, and the Ar gas is discharged from the reaction gas nozzle 32, a combination of the types of the inert gases may be properly changed depending on the intended use. For example, the rare gas such as an Ar gas or a He gas may be supplied from both of the reaction gas nozzles 31 and 32. On the contrary, the $N_2$ gas may be supplied from the reaction gas nozzle 32. This change is similarly applicable to the separation gas nozzles 41 and 42. A desirable inert gas can be selected depending on the intended use.

In step 2, a flow process of flowing a first oxidation gas is performed. In the flow process of flowing the first oxidation gas, the $N_2$ gas is continuously supplied from the reaction gas nozzle 31 in the first process area P1 and the separation gas nozzles 41, 42. However, an $O_3$ gas is supplied as the oxidation gas from the reaction gas nozzle 32 into the second process area P2. The above state is maintained while the turntable 2 rotates at least one turn. The wafer W continues to rotate at a predetermined rotational speed continuously from step 1. The rotational speed in the first embodiment is 6 rpm. The flow process of flowing the first oxidation gas is a preflow process of the oxidation gas to expose the entire surface of the wafer W to the oxidation gas. As a preparation of the surface, the most upper surface of the wafer W is oxidized. With this, the wafer W is oxidized by supplying the $O_3$ gases onto a plurality of wafers W arranged along the peripheral direction of the turntable to resultantly causing the plurality of wafers W to be in the same condition. The reason why the turntable 2 is rotated by at least one turn is that the $O_3$ gas is supplied only from the reaction gas nozzle 32, and it is necessary to cause all the wafers W to pass through the lower area of the reaction gas nozzle 32 by at least the one turn of the turntable 2 in order to supply the $O_3$ gas onto the surfaces of all of the plurality of wafers W irrespective of the position of the reaction gas nozzle 32 relative to the plurality of wafers W.

The supply of the $O_3$ gas may be performed a plurality of turns in the wafer W as long as the process does not require a restriction of minimizing the oxidation. Therefore, the wafer W may be turned more than one turn under the state where the $O_3$ gas is being supplied. For example, the wafer W may be turned, for example, 2 or 3 turn or 1.5 turns having a fraction in the flow process of flowing the first oxidation gas.

In Step 3, a film deposition process of depositing zirconium oxide (generally referred to as "ZrO" and may contain "$ZrO_2$"). In the film deposition process of depositing zirconium oxide (ZrO), a tetrakis(ethylmethylamino)zirconium (TEMAZ) gas as one type of an organometallic gas containing Zr is supplied from the reaction gas nozzle 31 to the wafer W, and the $O_3$ gas is supplied from the reaction gas nozzle 32 to the wafer W. Said differently, the TEMAZ gas and the $O_3$ gas are simultaneously supplied in the film deposition process of depositing zirconium oxide. However, because these gases are separated by the separating area D and are scarcely mixed inside the chamber 1.

When the TEMAZ gas and the $O_3$ gas are simultaneously supplied, the TEMAZ gas adsorbs onto the surface of the wafer W oxidized in the flow process of flowing the first oxidation gas of step 2 after the wafer W passes through the first process area P1 by the rotation of the turntable 2. At this time, because the surfaces of all the wafers W are oxidized by the flow process of flowing the first oxidation gas, the TEMAZ gas can adsorb onto the surfaces of all the wafers W without problem. Subsequently, after the wafer W passes through the second process area P2, the TEMAZ gas adsorbing onto the wafer W is oxidized by the $O_3$ gas so that a zirconium oxide (ZrO) film (a molecular layer of ZrO and may contain $ZrO_2$) is deposited on the surface of the wafer W. Thereafter, the turntable 2 is rotated the predetermined turns until the zirconium oxide (ZrO) film having a predetermined film thickness is deposited. Said differently, in the film deposition process of depositing $ZrO_3$ of step 3, the turntable 2 is repeatedly rotated until the zirconium oxide (ZrO) film has a predetermined film thickness. Because the zirconium oxide (ZrO) film equal to one layer is formed after the one turn of the turntable 2, it is possible to control the film thickness of the zirconium oxide (ZrO) film by adjusting the number of turns.

Further, the film deposition process depositing $ZrO_2$ in step 3 is finished by stopping supplying the TEMAZ gas and the $O_3$ gas. Because the supply of the TEMAZ gas and the $O_3$ gas is substantially simultaneously stopped, at a stage of finishing the film deposition process of depositing zirconium oxide (ZrO) of step 3, there are both the wafer W, onto a surface of which the TEMAZ gas is adsorbing, and the wafer W, on which the $ZrO_2$ film is deposited after the $O_3$ gas is supplied after the TEMAZ gas adsorbs onto the wafer W.

In step 4, a flow process of flowing a second oxidation gas is performed. In the flow process of flowing the second oxidation gas, the $N_2$ gas is supplied from the reaction gas nozzle 31 provided in the first process area P1 and the separation gas nozzles 41 and 42 provided in the separating area 0, and the $O_3$ gas is supplied from the reaction gas nozzle 32 provided in the second process area P2. Under this state, the turntable 2 is rotated at least one turn, and all the plurality of wafers mounted on the upper surface of the turntable 2 are exposed to the $O_3$ gas. With this, the wafer W whose film deposition process of depositing zirconium oxide (ZrO) of step 3 is finished while passing through the second process area P2 can completely pass through the second process area P2 in the process of flowing the second oxidation gas. Then, the oxidation treatment is performed to thereby deposit the zirconium oxide (ZrO) film. Thus, the film deposition process of depositing the zirconium oxide (ZrO) film can be completely finished.

The flow process of flowing the first oxidation gas in step 2 and the flow process of flowing the second oxidation gas in step 4 may be performed the same number of turns or different number of turns. From a point of view of enhancing the throughput, each process of the flow process of flowing the first oxidation gas in step 2 and the flow process of flowing the second oxidation gas in step 4 may be performed one turn, for example. Because the flow process of flowing the first oxidation gas and the flow process of flowing the second oxidation gas are mutually independent, the numbers of turns for these processes can be arbitrarily determined depending on the intended use.

In Step 5, a film deposition process of depositing aluminum oxide (generally referred to as "AlO" and may contain "$Al_2O_3$"). In the film deposition process of depositing aluminum oxide (AlO), a trimethylaluminum (TMA) gas as one type of an organometallic gas containing Al is supplied from the reaction gas nozzle 31 to the wafer W, and the $O_3$ gas is supplied from the reaction gas nozzle 32 to the wafer W. Said differently, the TMA gas and the $O_3$ gas are simultaneously supplied in the film deposition process of depositing aluminum oxide. However, because these gases are separated by the separating area D and are scarcely mixed inside the chamber 1.

When the TMA gas and the $O_3$ gas are simultaneously supplied, the TMA gas adsorbs onto the surface of the wafer W oxidized in the flow process of flowing the second oxidation gas at step 5 after the wafer W passes through the first process area P1 by the rotation of the turntable 2. If the TEMAZ gas is adsorbing onto the surface of the wafer W, the TMA gas does not adsorb onto the wafer W. However, the surfaces of all the wafers W are oxidized in the flow process of flowing the second oxidation gas of step 4 to have the zirconium oxide (ZrO) film deposited on the surfaces of all the wafers W and the preparation of surfaces is performed, the TMA gas adsorbs onto the surfaces of the wafers W without problem. Subsequently, when the wafers W pass through the second process area P2, the TMA gas adsorbing onto the surfaces of the wafers W is oxidized by the $O_3$ gas so that an aluminum oxide (AlO) film (a molecular layer of AlO and may contain $Al_2O_3$). Thereafter, the turntable 2 is rotated the predetermined turns until the aluminum oxide (AlO) film having a predetermined film thickness is deposited. Said differently, in the film deposition process of depositing aluminum oxide (AlO) of step 5, the turntable 2 is repeatedly rotated until the aluminum oxide (AlO) film has a predetermined film thickness.

However, the main component of the ZrAlO film used as the High-k film ordinarily is a zirconium oxide (ZrO) film, and the aluminum oxide (AlO) film is merely added. Therefore, the turntable 2 may be rotated only one turn. Because the aluminum oxide (AlO) film equal to one layer is deposited one turn of the turntable 2, the aluminum oxide (AlO) film having a film thickness corresponding to one layer may be deposited.

Further, the film deposition process depositing aluminum oxide AlO in step 5 is finished stopping supplying the TMA gas and the $O_3$ gas. Because the supply of the TMA gas and the $O_3$ gas is substantially simultaneously stopped, at a stage of finishing the film deposition process of depositing aluminum oxide (AlO) of step 5, there are both the wafer W, onto a surface of which the TMA gas is adsorbing, and the wafer W, on which the aluminum oxide (AlO) film is deposited after the $O_3$ gas is supplied after the TMA gas adsorbs onto the wafer W.

After step 5, the process returns again to step 2 and the flow process of flowing the first oxidation gas is performed. The content of the flow process of flowing the first oxidation gas is similar to the content in step 2. The $O_3$ gas is supplied from the reaction gas nozzle 33, and the N2 gas is supplied from the reaction gas nozzle 31 and the separation gas nozzles 41 and 42 while rotating the turntable 2 one turn or more turns.

However, surface conditions of the plurality of wafers W in the flow process of flowing the first oxidation gas of the second time or later are different from those in the flow process of flowing the first oxidation gas of the first time. Namely, in the flow process of flowing the first oxidation gas of the second time or later, both the wafer W onto which the TMA gas adsorbing and the wafer W on which the aluminum oxide (AlO) film is deposited exist. Said differently, in the flow process of flowing the first oxidation gas of the second time or later, the surfaces of the wafers W, on which the TMA gas is adsorbing, are oxidized to deposit the aluminum oxide (AlO) film on the surfaces of the wafers W and simultaneously all the surfaces of the wafers W are oxidized. Thus, a preparation of surfaces is performed for the film deposition process of depositing zirconium oxide (ZrO) in step 3, which is performed next. As described, the flow process of flowing the first oxidation gas of step 2 of the first time functions only as a process of preparing the surfaces for the film deposition process of depositing zirconium oxide (ZrO). However, the flow process of flowing the first oxidation gas of step 2 of the second time or later functions as a process of perfecting the film deposition of completely oxidizing the TMA gas, which is adsorbing onto the surfaces of the wafers W in the film deposition process of depositing aluminum oxide (AlO).

After the flow process of flowing the first oxidation gas of step 2 of the second time finishes, the film deposition process of depositing zirconium oxide (ZrO) of step 3, the flow process of flowing the second oxidation gas of step 4, and the film deposition process of depositing aluminum oxide (AlO) of step 5 are repeated. Thereafter, cycles of step 2 to step 5 are repeated until a ZrAlO film having a laminate structure having a predetermined film thickness is obtained. Said differently, in the method of depositing the film of the first embodiment, step 2 to step 5 are performed as one cycle, and the cycle of step 2 to step 5 is repeated to obtain a ZrAlO film having a predetermined laminate structure. Because the contents of the processes in the steps are similar to those described above, explanation thereof is omitted.

After the cycles of step 2 to step 5 are repeated the predetermined times, the flow process of flowing the first oxidation gas of step 2 and the film deposition process of depositing zirconium oxide (ZrO) of step 3 are performed and the process goes to a post-flow process of the oxidation gas of step 6.

In the post-flow process of the oxidation gas of step 6, in a manner similar to the flow process of flowing the second oxidation gas in step 4, the $N_2$ gas is supplied from the reaction gas nozzle 31 provided in the first process area 21 and the separation gas nozzles 41 and 42 provided in the separating area D, and the $O_3$ gas is supplied from the reaction gas nozzle 32 provided in the second process area 22. Under this state, the turntable 2 is rotated at least one turn, and all the plurality of wafers mounted on the upper surface of the turntable 2 are exposed to the $O_3$ gas. With this, the wafer W whose film deposition process of depositing zirconium oxide (ZrO) of step 3 is finished while passing through the second, process area P2 can completely pass through the second process area P2 in the post-flow process of the oxidation gas. Then, the oxidation treatment is performed to thereby deposit the zirconium oxide (ZrO) film. Thus, the film deposition process of depositing the zirconium oxide (ZrO) film can be completely finished.

Because the post-flow process of the oxidation gas is basically similar to the flow process of flowing the second oxidation gas of step 4, it is sufficient to rotate the turntable 2 at least one time while supplying the $O_3$ gas. However, in order to improve film quality, it is possible to rotate the turntable 2 more than one turn. Said differently, the ZrAlO film is sufficiently supplied with oxygen atoms to form a film having few defects by performing the oxidation treatment sufficiently after once forming the ZrAlO film having the laminate structure. Thus, the film quality of the ZrAlO film can be improved.

Therefore, the post-flow process of the oxidation gas can be performed for longer time duration than those for the flow process of flowing the first oxidation gas and the flow process of flowing the second oxidation gas. With this, in addition to complete oxidation of the TEMAZ gas in the film deposition process of depositing zirconium oxide (ZrO), the film quality can be simultaneously improved.

In step 7, the stand-by process is performed. In the stand-by process, the $N_2$ gas is supplied from the reaction gas nozzle 31 and the separation gas nozzles 41 and 42, the Ar gas is supplied from the reaction gas nozzle 32 so that the inside of the chamber 1 is filled with the inert gas. After the stand-by process is continued for the predetermined time duration, the supply of the inert gas (the $N_2$ gas and the Ar gas) to the chamber 1 is stopped and the rotation of the turntable 2 is stopped. Thereafter, the wafer W is carried out of the chamber 1 by an inverse process of the process transferring the wafer W inside the chamber 1. With this, the ZrAlO film deposition process is finished.

As described, according to the method of depositing the film of the first embodiment, by inserting the flow process of flowing the oxidation gas between the two film deposition processes, the flow processes of flowing the oxidation gas are performed before and after the two film deposition processes. Therefore, the raw gas adsorbing onto the wafers W are surely and completely oxidized in the film deposition processes, and simultaneously the preparations of surfaces for the film deposition processes can be surely performed. Thus, an efficient and ensured film deposition cycle can be performed.

FIG. 6 illustrates an example where the post-flow process of the oxidation gas of step 6 is performed after the deposition process of depositing zirconium oxide (ZrO) in step 3. However, the post-flow process of the oxidation gas in step 6 is performed after the film deposition process of depositing aluminum oxide (AlO) of step 5. Said differently, after one type of oxide film between two types of oxide film has been deposited by the film deposition process, the post-flow process of the oxidation gas is performed to finish the film deposition process. The final film deposition process may be the film deposition process of depositing any one of the oxide films depending on the intended use.

Further, an example that the $O_3$ gas is used as the oxidation gas is explained in FIG. 6. However, various oxidation gases can be used. For example, a gas such as water ($H_2O$), oxygen, or radical oxygen may be used.

Figure 7:
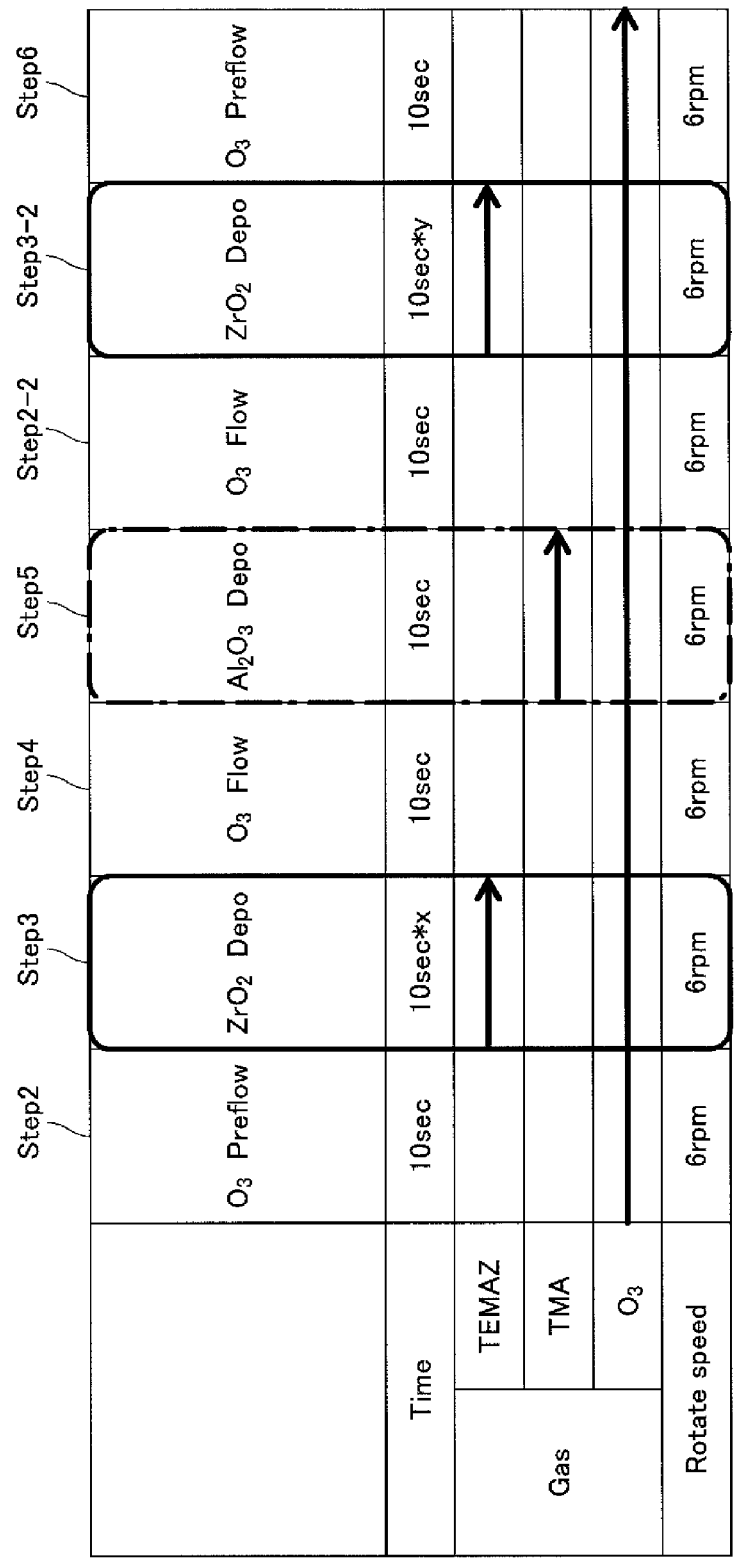
FIG. 7 is a timing chart illustrating an exemplary method of depositing the film of the first embodiment.

FIG. 7 is a timing chart illustrating a part of a principal process of depositing the film of the first embodiment. Referring to FIG. 7, the steps in FIG. 6 corresponding to the sequence diagram of the method of depositing the film are illustrated, and the step of the second time is expressed using a hyphen and an additional reference number like "step 2-2".

Referring to FIG. 7, time duration of each step, supply timings of each gas, and the rotational speed of the turntable 2 are illustrated.

The revolution speed of the turntable 2 is set to 6 rpm through every step. Said differently, in the method of depositing the film of the first embodiment, the revolution speed of the turntable 2 is, for example, constant and 6 rpm.

In step 2, the flow process of flowing the first oxidation gas is performed. At this step, the $O_3$ gas is supplied. The time duration for the flow process of flowing the first oxidation gas is 10 seconds and the rotational speed of the turntable 2 is 6 rpm. Therefore, the turntable 2 is rotated one turn.

In step 3, the film deposition process of depositing zirconium oxide (ZrO) is performed. In the film deposition process of depositing zirconium oxide (ZrO), the TEMAZ gas is supplied while maintaining the supply of the $O_3$ gas. The film deposition process of depositing zirconium oxide (ZrO) is basically one turn per 10 seconds, and a cycle for 10 seconds is repeated predetermined times as needed. The number of times of repeating the cycles is determined on a film thickness of the zirconium oxide (ZrO) film deposited one lamination. After finishing the film deposition process of depositing zirconium oxide (ZrO), the supply of the TEMAZ gas is stopped.

In step 4, the flow process of flowing the second oxidation gas is performed. In the flow process of flowing the second oxidation gas, the supply of the TEMAZ gas is stopped and the turntable 2 is rotated one turn while the supply of the $O_3$ gas continues. The TEMAZ gas is completely oxidized and the zirconium oxide (ZrO) film is deposited by the flow process of flowing the second oxidation gas.

In step 5, the film deposition process of depositing aluminum oxide (AlO) is performed. In the film deposition process of depositing aluminum oxide (AlO), the TMA gas is supplied while maintaining the supply of the $O_3$ gas. With this, the aluminum oxide (AlO) is deposited. Because the aluminum oxide (AlO) film can be sufficiently thinner than the zirconium oxide (ZrO), the turntable 2 is rotated one turn in the film deposition process of depositing aluminum oxide (AlO). After finishing the film deposition process of depositing aluminum oxide (AlO), the supply of the TMA gas is stopped.

In step 2-2, the flow process of flowing the first oxidation gas of the second time is performed. In the flow process of flowing the first oxidation gas of the second time, under a state where the supply of the TMA gas is stopped and the $O_3$ gas is continuously supplied, the turntable 2 rotates one turn. The TMA gas adsorbing onto the surfaces of the wafers W are completely oxidized by the flow process of flowing the first oxidation gas of the second time. Therefore, all the TMA gas is deposited as the $Al_2O_3$ film.

In step 3-2, the film deposition process of depositing zirconium oxide (ZrO) of the second time is performed. Because the film deposition process of depositing zirconium oxide (ZrO) of the second time is completely similar to the film deposition process of depositing zirconium oxide (ZrO) of the first time, the explanation is omitted.

In step 6, the post-flow process of the oxidation gas is performed. With this, all the TEMAZ gas adsorbing onto the surfaces of the wafers W is oxidized and is deposited as the zirconium oxide (ZrO) film.

As described, according to the method of depositing the film of the first embodiment, the rotational speed of the turntable 2 is made constant and the processes of supplying only the $O_3$ gas is inserted before and after the film deposition processes. Therefore, under a state where all the raw gas is oxidized in the film deposition processes, the next film deposition process can be performed to thereby surely perform a laminate film deposition.

Second Embodiment

Figure 8:
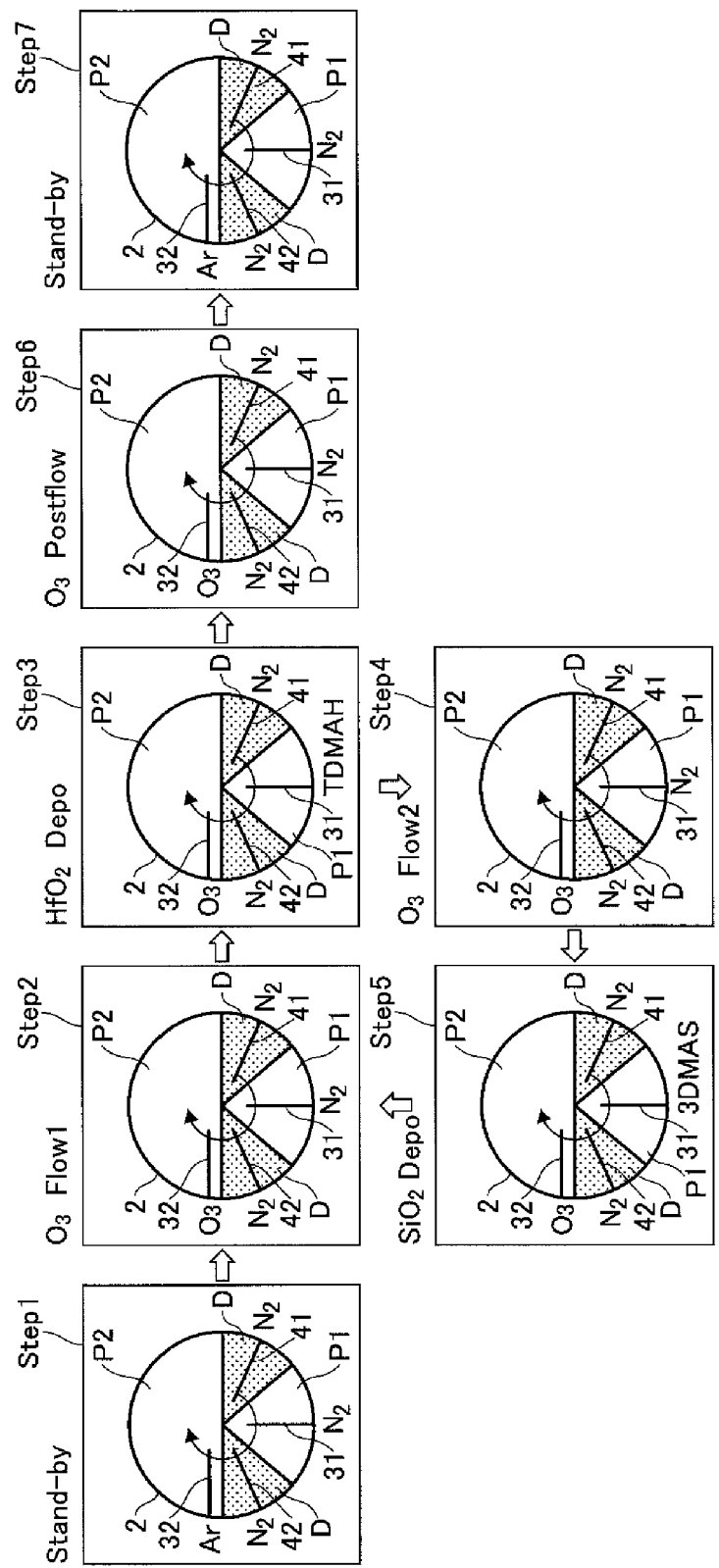
FIG. 8 is sequential diagrams illustrating an exemplary sequence of a method of depositing the film of a second embodiment using a turntable.

FIG. 8 is a sequential diagram illustrating an example of a method of depositing a film of a second embodiment of the present invention. Within the method of depositing the film of the second embodiment, an example that an HfSiO film of a laminate structure including a hafnium oxide (HfO) film and a silicon oxide (generally referred to as "SiO" and may contain $SiO_2$) film are formed as a film is explained. The HfSiO film is a film used as a High-k film having high electric permittivity.

As to a film deposition apparatus of the second embodiment, an example that a film deposition apparatus similar to the film deposition apparatus described in the first embodiment is described. As to contents similar to the first embodiment, the explanation is properly omitted or simplified.

Referring to FIG. 8, a stand-by process is performed in step 1. The introduction of the wafer W into the chamber 1 is the same as that described in the first embodiment. Therefore, the contents are omitted. As to the stand-by process, the Ar gas is supplied from the reaction gas nozzle 31. While an Ar gas is supplied from the reaction gas nozzle 31 and the $N_2$ gas is supplied from the separation gas nozzles 41 and 42, the turntable 2 is rotated. Because the stand-by process is similar to that of the first embodiment, a detailed description thereof is omitted.

In step 2, the first flow process of flowing the first oxidation gas is performed. However, because the flow process of flowing the first oxidation gas is similar to that in the first embodiment, the explanation is omitted.

In step 3, a film deposition process of depositing hafnium oxide (HfO) is performed. In the film deposition process of depositing hafnium oxide (HfO), a tetrakis(dimethylamino) hafnium (TDMAH) gas containing Hf is supplied from the reaction gas nozzle 31 existing in the first process area P1, the $O_3$ gas is subsequently supplied from the reaction gas nozzle 32 in the second process area P2 like the process of flowing the first oxidation gas.

When the TDMAH gas and the $O_3$ gas are simultaneously supplied, the TDMAH gas adsorbs onto the surface of the wafer W oxidized in the flow process of flowing the first oxidation gas at step 2 after the wafer W passes through the first process area P1 by the rotation of the turntable 2. At this time, because the surfaces of all the wafers W are oxidized by the flow process of flowing the first oxidation gas, the TDMAH gas can adsorb onto the surfaces of all the wafers W without problem. Subsequently, after the wafer W passes through the second process area P2, the TDMAH gas adsorbing onto the wafer W is oxidized by the $O_3$ gas so that a hafnium oxide film (a molecular layer of HfO and may contain $HfO_2$) is deposited on the surface of the wafer W. Thereafter, the turntable 2 is rotated the predetermined turns until the hafnium oxide (HfO) film having a predetermined film thickness is deposited. Said differently, in the film deposition process of depositing hafnium oxide (HfO) of step 3, the turntable 2 may be repeatedly rotated until the hafnium oxide (HfO) film has a predetermined film thickness. Because the zirconium oxide (ZrO) film equal to one layer is formed after the one turn of the turntable 2, it is possible to control the film thickness of the hafnium oxide (HfO) film by adjusting the number of turns.

Further, the film deposition process depositing hafnium oxide HfO in step 3 is finished by stopping supplying the TEMAH gas and the $O_3$ gas. Because the supply of the TDMAH gas and the $O_3$ gas is substantially simultaneously stopped, at a stage of finishing the film deposition process of depositing hafnium oxide (ZrO) of step 3, there are both the wafer W, onto a surface of which the TDMAH gas is adsorbing, and the wafer W, on which the hafnium oxide (HfO) film is deposited after the $O_3$ gas is supplied after the TDMAH gas adsorbs onto the wafer W.

In step 4, the flow process of flowing the second oxidation gas is performed. In the flow process of flowing the second oxidation gas, the N2 gas is supplied from the reaction gas nozzle 31 and the $O_3$ gas is supplied from reaction gas nozzle 32. Thus, all the TDMAH gas adsorbing onto the surface of the wafer W is oxidized so that a hafnium oxide (HfO) film is formed from the TDMAH gas remaining on the surface of the wafer W. Because the detailed content of the flow process of flowing the second oxidation gas is similar to that in the first embodiment, a detained description of the flow process of flowing the second oxidation gas is omitted.

In step 5, a film deposition process of depositing silicon oxide (SiO) is performed. In the film deposition process of depositing silicon oxide (SiC), tris(dimethylaminosilane) (3DMAS) gas is supplied from the reaction gas nozzle 31 of the first process area P1 and the O3 gas is supplied from the reaction gas nozzle 32 of the second process area P2. Further, the $N_2$ gas is supplied from the separation gas nozzles 41 and 42.

By the film deposition process of depositing silicon oxide (SiO), the silicon oxide film (SiO) is formed on the surface of the wafer W. Because the mechanism of forming the film is similar to that described in the film deposition process of depositing the hafnium oxide, the detailed description of the film deposition process of depositing the hafnium oxide is omitted. After finishing the film deposition process of depositing SiO, the supply of the 3DMAS gas and the $O_3$ gas is simultaneously stopped. Therefore, there are produced a wafer W, onto a surface of which the 3DMAS gas is adsorbing, and a wafer W, on which the silicon oxide (SiO) film is deposited by oxidizing the above wafer W.

In step 2-2, the process goes to step 2 where the flow process of flowing the first oxidation gas of a second time is performed. In the flow process of flowing the first oxidation gas of the second time, the $N_2$ gas is supplied from the reaction gas nozzle 31, and the $O_3$ gas is supplied from reaction gas nozzle 32. Thus, all the 3DMAS gas adsorbing onto the surface of the wafer W is oxidized so that a $SiO_2$ film is formed from the 3DMAS gas remaining on the surface of the wafer W. Because the detailed content of the flow process of flowing the first oxidation gas of the second time is similar to that in the first embodiment, a detained description of the flow process of flowing the first oxidation gas is omitted.

By repeating the cycle from step 2 to step 5, the HfSiO film having the laminate structure made of the hafnium oxide (HfO) film and the silicon oxide (SiO) film is deposited. Until a predetermined film thickness is obtained, the cycle from step 2 to step 5 is repeated. After the HfSiO film having the predetermined film thickness is obtained, the process goes to step 6 after finishing step 2 and step 3.

In step 6, the post-flow process of the oxidation gas is performed to supply the $N_2$ gas from the reaction gas nozzle 31 and to supply the $O_3$ gas from the reaction gas nozzle 32. With this, the TDMAH gas adsorbing onto the surface of the wafer W is oxidized all the raw gas so as to be deposited as a hafnium oxide (HfO) film. Meanwhile, because the detailed explanation of the post-flow process of the oxidation gas is similar to that in the first embodiment, the explanation is omitted.

In step 7, a stand-by process is performed, and the film deposition process ends. Because the stand-by process is similar to the method of depositing the film of the first embodiment, the explanation of the stand-by process is omitted.

Although the process is transferred from step 3 to step 6 in FIG. 8, the process may be transferred from step 5 to step 6 in a manner similar to the first embodiment.

FIG. 9B illustrates an example of a film structure obtained by the method of depositing the film of the second embodiment of the present invention. FIG. 9A illustrates a single film made of hafnium oxide as a comparative example.

FIG. 9B illustrates an exemplary HfSiO film having the laminated structure of the second embodiment. As illustrated in FIG. 9B, the hafnium (HfO) film and the silicon oxide (SiO) film are alternately laminated to form a laminated body. Because the hafnium oxide (HfO) is thicker than the silicon oxide (SiO) film, the silicon oxide (SiO) film is inserted between the hafnium oxide (HfO) film. Within the method of depositing the film of the second embodiment, the laminated body of High-k film as illustrated in FIG. 9B can be surely deposited with high productivity.

Within the second embodiment, aluminum oxide (AlO) may be used instead of the silicon oxide (SiO) film. Therefore, referring to FIG. 9B, the aluminum oxide (AlO) is illustrated in parallel with the silicon oxide film. In a case where the aluminum oxide (AlO) film is formed, the TMA gas may be used as described in the first embodiment. By performing the method of depositing the film of the second embodiment using the TMA gas instead of the 3DMAS gas, the HfALO film having the laminate structure of the hafnium oxide (HfO) films and the aluminum oxide (AlO) films can be deposited.

FIG. 9C illustrates an exemplary HfSiO film of a stack type as a comparative example. In the method of depositing the film of the second embodiment, the turntable 2 is used. Therefore, it is possible to obtain the High-k film having the multistage laminate structure by thinning the layers illustrated in FIG. 9B. However, in a manner similar to the CVD method, in a method of depositing the film where the film type is switched by switching an introduced gas, a time is required to switch the film type. Therefore, it is evitable to adapt the structure illustrated in FIG. 9C. Therefore, it is difficult to form the High-k film having even electric permittivity.

On the other hand, in the method of depositing the film of the second embodiment, it is possible to deposit the hafnium oxide (HfO) film and the silicon oxide (SiO) film (or the aluminum oxide (AlO) film) in one cycle. Therefore, it is possible to deposit the High-k film having the laminate structure illustrated in FIG. 9B and to manufacture the High-k film having the even electric permittivity.

FIG. 9D illustrates ratios of the SiO film and the AlO film included on a HfSiO film and a HfAlO film, which are obtained by the method of depositing the film of the second embodiment, relative to the hafnium oxide (HfO) of the HfSiO film and the HfAlO film. As illustrated in FIG. 9D, in the method of depositing the film of the second embodiment, the ratio of the silicon oxide (SiO) film or the aluminum oxide (AlO) film relative to the hafnium oxide (HfO) film is 2% at minimum and 50% at maximum, and can be adjusted to a desirable ratio of 5%, 10%, and 15%. According to the method of depositing the film of the second embodiment, it is possible to deposit a thin film in a level of one atomic layer by the ALD method or the MLD method using the turntable 2. Therefore, it is possible to highly accurately control the ratio of the added film.

Within the first and second embodiments, the examples that the laminate structure of the ZrAlO film and the HfSiO film are deposited are explained. In the manner similar to the examples, the raw gases are variously changed to thereby form an oxide film of the laminate structure containing various elements. Within the method of depositing the oxide film of the first and second embodiments, by inserting the oxidizing process of oxidizing a plurality of wafers W between the film deposition process of depositing the oxide film containing the first element and the film deposition process of depositing the oxide film containing the second element, it is possible to perform the film deposition process by constantly interposing the oxidizing process, to surely oxidize the raw gas, and to deposit the plurality of wafers in the same condition.

The first element and the second element are preferably a metal element or a semiconductor element. For example, the oxide film of the laminate structure can be manufactured by variously combining the elements such as Zr, Hf, Al, Ti, Sr, Si or the like depending on an intended use.

Third Embodiment

Figure 10:
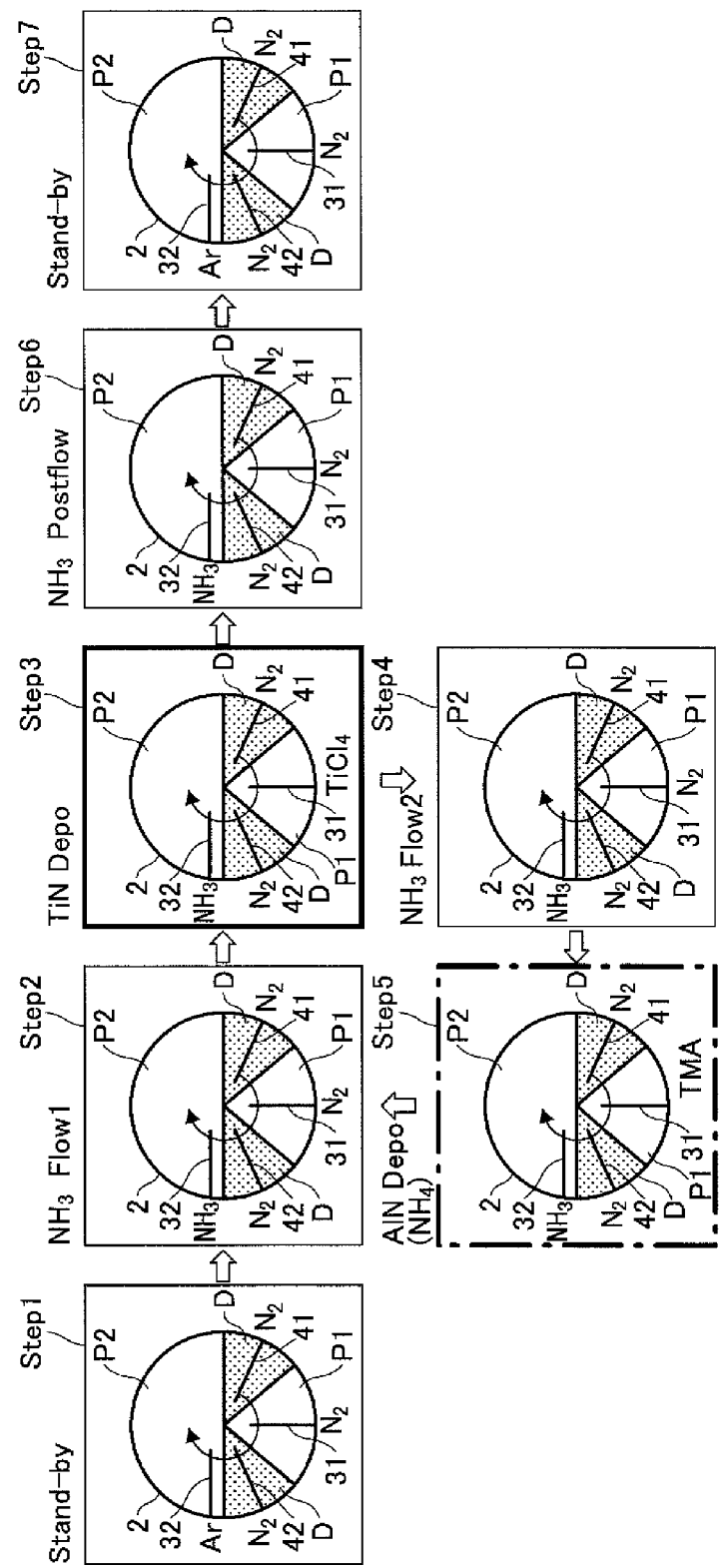
FIG. 10 is sequential diagrams illustrating an exemplary sequence of a method of depositing the film of a third embodiment using a turntable.

FIG. 10 is a sequential diagram illustrating an example of the method of depositing the film of a third embodiment of the present invention. Within the first and second embodiments, an example that the oxide film is formed is explained. Within the third embodiment, an example that the nitride film is formed is explained. Specifically, in the method of depositing the film of the third embodiment, an example of depositing a TiAlN film of a laminate structure including a TiN film and an AlN film is described. The TiAlN film is a film used as a so-called High-k film having high electric permittivity.

As to a film deposition apparatus of the third embodiment, an example that a film deposition apparatus similar to the film deposition apparatuses described in the first and second embodiments is described. As to contents similar to the first and second embodiments, the explanation is properly omitted or simplified.

Referring to FIG. 10, in a manner similar to the first and second embodiments, the turntable 2, a reaction gas nozzle 31 of a first process area P1, a reaction gas nozzle 32 of a second process area P2, and separation gas nozzles 41 and 42 of a separating area D are illustrated.

Before step 1, a plurality of wafers W are sequentially introduced into the chamber 1 through a transfer opening 15 and are sequentially mounted on circular concave portions 24 on the upper surface of the turntable 2. Because this is similar to the first and second embodiments, explanation is omitted.

In step 1, a stand-by process is performed. Because the stand-by process is similar to the description of the first and second embodiments, an explanation of the stand-by process is omitted. Although, the rotational speed of the turntable 2 can be variously changed depending on an intended use. Within the third embodiment, an example of the rotational speed is 240 rpm.

In step 2, a flow process of flowing a first nitriding gas is performed. In the flow process of flowing the first nitriding gas, a $N_2$ gas is supplied from the reaction gas nozzle 31 in the first process area P1 and the separation gas nozzles 41 and 42, and a $NH_3$ gas is supplied from the reaction gas nozzle 32 in the second process area P2. Under this state, the turntable 2 is rotated at least one turn. Thus, the surface of the wafer W is nitrided and preparation of the surface is conducted.

In step 3, a film deposition process of forming TiN is performed. In the film deposition process of depositing TiN, a $TiCl_4$ gas is supplied from the reaction gas nozzle 31, the NH$_3$ gas is supplied from the reaction gas nozzle 32, and the N$_2$ gas is supplied from the separation gas nozzles 41 and 42. Under the state, the turntable 2 rotates a predetermined number of turns.

When the TiCl$_4$ gas and the NH$_3$ gas are simultaneously supplied, the wafer W passes through the first process area P1 the rotation of the turntable 2. Then, a TiCl$_4$ gas adsorbs onto the surface of the wafer W nitrided in step 2. Subsequently, after the wafer W passes through the second process area P2, the TiCl$_4$ gas adsorbing onto the surface of the wafer W is nitrided the NH$_3$ gas. Thus, a TiN film (a molecular layer of TiN) is formed on the surface of the wafer W. Thereafter, the turntable 2 is rotated a predetermined number of times until the TiN film having a predetermined film thickness is formed. Then, the film deposition process of depositing TiN is finished by stopping the supply of the TiCl$_4$ gas and the supply of the NH$_3$ gas.

In a case where the supply of the TiCl$_4$ gas and the supply of the NH$_3$ gas are simultaneously stopped, there are produced a wafer W, onto a surface of which the TiCl$_4$ gas is adsorbing, and a wafer W, on which the TiN film is deposited by oxidizing the TiCl$_4$ gas. This is similar to the deposition of the oxide in the first and second embodiments.

In step 4, a flow process of flowing the second nitriding gas is performed. In the flow process of flowing the second nitriding gas, in a manner similar to the flow process of flowing the first nitriding gas, the N2 gas is supplied from the reaction gas nozzle 31 and the separation gas nozzles 41 and 42, and the NH$_3$ gas is supplied from the reaction gas nozzle 32. Under the state, the turntable 2 is rotated at least one turn. In the flow process of flowing the second nitriding gas, all the TiCl4 gas adsorbing onto the surface of the wafer W is nitrided. Thus, the TiN film is formed.

In step 5, a film deposition process of forming AlN is performed. In the film deposition process of depositing AiN, a TMA gas is supplied from the reaction gas nozzle 31, the NH$_3$ gas is supplied from the reaction gas nozzle 32, and the N$_2$ gas is supplied from the separation gas nozzles 41 and 42. Under the state, the turntable 2 rotates the predetermined number of turns. With this, the AlN film is formed on the surface of the wafer W. Although the turntable 2 can be rotated until the AlN film having the predetermined film thickness is formed, because the AlN film is an added film, the turntable 2 is rotated a number of turns fewer than that in forming the TiN film. Because all the TiCl$_4$ gas is nitrided in step 4, the TMA gas preferably adsorbs onto the surface of the wafer W, and the AlN film is sequentially deposited by supplying the NH$_3$ gas.

However, because the supply of the TMA gas and the supply of the NH$_3$ gas simultaneously stop after finishing the film deposition process of depositing AlN, there is produced a wafer W, onto which the TMA gas is adsorbing.

Then, the process returns again to step 2, and the flow process of flowing the first nitriding gas of the second time is performed. In the flow process of flowing the first nitriding gas of the second time, while the N$_2$ gas is supplied from the reaction nozzle 31 and the separation gas nozzles 41 and 42, and the NH$_3$ gas is supplied from the reaction gas nozzle 32, the turntable 2 is rotated at least one turn. With this turn of the turntable 2, all the TMA gas adsorbing onto and remaining on the surface of the wafer W without being nitrided in the AlN film deposition process is nitrided and the AlN film is formed.

In a manner similar to the above, steps 3 to 5 are performed so that steps 2 to 5 forming one cycle are repeated a predetermined number of times so as to deposit the TiAlN film having the laminate structure.

After forming the TiAlN film having the predetermined film thickness, steps 2 and 3 are performed and the process goes to step 6.

In step 6, a post-flow process of the nitriding gas is performed. In the post-flow process of flowing the nitriding gas, the N$_2$ gas is supplied from the reaction gas nozzle 31 provided in the first process area P1 and the separation gas nozzles 41 and 42 provided in the separating area D, and the NH$_3$ gas is supplied from the reaction gas nozzle 32 provided in the second process area P2. With this, the film deposition process is finished under the state where all the TiCl$_4$ gas remaining without being nitrided is nitrided.

In step 7, a stand-by process is performed. In the stand-by process, the N$_2$ gas is supplied from all nozzles 31, 32, 41, and 42 of the reaction gas nozzles 31 and 32 and the separation gas nozzles 41 and 42. The inside of the chamber 1 is filled with the N$_2$ gas. After continuing the stand-by process for a predetermined time, the supply of the N$_2$ gas to the chamber 1 is stopped and the rotation of the turntable 2 is stopped. Thereafter, the wafer W is carried out of the chamber 1 by an inverse process of the process transferring the wafer W inside the chamber 1. With this, the TiAlN film deposition process is finished.

Within the method of depositing the film of the third embodiment, the nitride film having the laminate structure can be surely deposited.

Within the third embodiment, the process of depositing the TiAlN film is described. However, the nitride film having the laminate structure containing various elements can be formed by variously changing the raw gas in a manner similar to the above. According to the method of depositing the nitride film of the third embodiment, a nitriding process of nitriding the plurality of wafers W between the film deposition process between the film deposition process of depositing the nitride film containing the first element and the film deposition process between the film deposition process of depositing the nitride film containing the second element. Therefore, the film deposition process can be performed by constantly interposing the nitriding process. With this, in both of the two film deposition processes, the raw gas can be surely nitrided and the plurality of wafers W can be deposited under the same conditions.

The first element and the second element are preferably a metal element or a semiconductor element. For example, the nitride film of the laminate structure can be manufactured by variously combining the elements such as Zr, Hf, Al, Ti, Sr, Si or the like depending on an intended use.

In a manner similar to the above, a material of an organic aminosilane gas such as bis(tertiary-butylamino) silane (BT-BAS) and an inorganic material such as dichlorosilane (SiH$_2$Cl$_2$) are supplied from the reaction gas nozzle 31, the NH$_3$ gas is supplied from the reaction gas nozzle 32 to deposit a silicon nitride film (the silicon nitride film may include Si$_3$N$_4$).

As described, according to the method of depositing the film of the third embodiment, the nitride film may be evenly deposited on the plurality of wafers.

According to the embodiment of the present invention, the laminate structure is surely and evenly formed on the plurality of wafers.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of depositing the film have been described in detail, it should be understood that the various changes, substitutions, and alterations could be made hereto without departing from the spirit and scope of the invention.

What is claimed is:

1. A method of depositing a film of forming an oxide film containing a predetermined first element and a predetermined second element on a plurality of substrates using a film deposition apparatus including
   a turntable that is accommodated in a chamber, is rotatable, and includes mounting portions formed on an upper surface of the turntable so that the substrates are mounted on the mounting portions,
   a first process area laid out above the upper surface of the turntable and being provided with a first gas supplying portion, which supplies gases toward the upper surface of the turntable,
   a second process area arranged apart from the first process area along a peripheral direction of the turntable and being provided with a second gas supplying portion, which supplies the gases toward the upper surface of the turntable, and
   a separation area including a separation gas supplying portion provided between the first process area and the second process area and supplying a separation gas onto the upper surface of the turntable, and a ceiling surface forming a narrow space so that the narrow space for introducing the separation gas supplied from the separation gas supplying portion to the first process area and the second process area is formed between the ceiling surface and the surface of the turntable, the method of depositing the film comprising:
   a first process of rotating the turntable at least one turn while the separation gas is supplied from the first gas supplying portion and the separation gas supplying portion, and an oxidation gas is supplied from the second gas supplying portion;
   a second process of depositing a first oxide film containing the first element onto the substrates by rotating the turntable a first predetermined number of turns while a first reaction gas containing the first element is supplied from the first gas supplying portion, the oxidation gas is supplied from the second gas supplying portion, and the separation gas is supplied from the separation gas supplying portion;
   a third process of rotating the turntable at least one turn under a state where the separation gas is supplied from the first gas supplying portion and the separation gas supplying portion, and the oxidation gas is supplied from the second gas supplying portion; and
   a fourth process of rotating the turntable at least a second predetermined number of turns in order to deposit a second oxide film containing the second element on the substrates under a state where a second reaction gas containing the second element is supplied from the first gas supplying portion, the oxidation gas is supplied from the second gas supplying portion, and the separation gas is supplied from the separation gas supplying portion, wherein the first to fourth processes form a single cycle;
   repeatedly performing the cycle a predetermined number of times so as to form a laminate structure of the first oxide film and the second oxide film;
   performing the first and second processes after repeatedly performing the cycle;
   a fifth process of subsequently rotating the turntable at least one turn while the separation gas is supplied from the first gas supplying portion and the separation gas supplying portion and the oxidation gas is supplied from the second gas supplying portion, the fifth process being performed longer than the first process or the third process; and
   a sixth process of rotating the turntable a predetermined number of turns while the separation gas is supplied from the first gas supplying portion and the separation gas supplying portion, and an inert gas is supplied from the second gas supplying portion.

2. The method of depositing the film according to claim 1, wherein the first predetermined number of turns is greater than the second predetermined number of turns, and
   the first oxide film is deposited to be thicker than the second oxide film.

3. The method of depositing the film according to claim 1, wherein the first and second elements are a metal element or a semiconductor element.

4. The method of depositing the film according to claim 3, wherein the metal element is any one of Hf, Zr, Al, Ti, and Sr, and
   the semiconductor element is Si.

5. The method of depositing the film according to claim 1, wherein the oxidation gas is an $O_3$ gas.

6. The method of depositing the film according to claim 1, wherein the separation gas is an inert gas.

7. A method of depositing a film of forming a nitride film containing a predetermined first element and a predetermined second element on a plurality of substrates using a film deposition apparatus including
   a turntable that is accommodated in a chamber, is rotatable, and includes mounting portions formed on an upper surface of the turntable so that the substrates are mounted on the mounting portions,
   a first process area laid out above the upper surface of the turntable and being provided with a first gas supplying portion, which supplies gases toward the upper surface of the turntable,
   a second process area arranged apart from the first process area along a peripheral direction of the turntable and being provided with a second gas supplying portion, which supplies the gases toward the upper surface of the turntable,
   a separation gas supplying portion provided between the first process area and the second process area and supplying a separation gas onto the upper surface of the turntable, and
   a separation area including a ceiling surface forming a narrow space so that the narrow space for introducing the separation gas supplied from the separation gas supplying portion to the first process area and the second process area is formed between the ceiling surface and the surface of the turntable, the method of depositing the film comprising:
   a first process of rotating the turntable at least one turn while the separation gas is supplied from the first gas supplying portion and the separation gas supplying portion, and a nitriding gas is supplied from the second gas supplying portion;
   a second process of depositing a first nitride film containing the first element onto the substrates by rotating the turntable a first predetermined number of turns while a first reaction gas containing the first element is supplied from the first gas supplying portion, the nitriding gas is supplied from the second gas supplying portion, and the separation gas is supplied from the separation gas supplying portion;

a third process of rotating the turntable at least one turn under a state where the separation gas is supplied from the first gas supplying portion and the separation gas supplying portion, and the nitriding gas is supplied from the second gas supplying portion; and a fourth process of rotating the turntable at least a second predetermined number of turns in order to deposit a second nitride film containing the second element on the substrates under a state where a second reaction gas containing the second element is supplied from the first gas supplying portion, the nitriding gas is supplied from the second gas supplying portion, and the separation gas is supplied from the separation gas supplying portion, wherein the first to fourth processes form a single cycle;

repeatedly performing the cycle a predetermined number of times so as to form a laminate structure of the first nitride film and the second nitride film;

performing the first and second processes after repeatedly performing the cycle;

a fifth process of subsequently rotating the turntable at least one turn while the separation gas is supplied from the first gas supplying portion and the separation gas supplying portion and the nitriding gas is supplied from the second gas supplying portion, the fifth process being performed longer than the first process or the third process; and a sixth process of rotating the turntable a predetermined number of turns while the separation gas is supplied from the first gas supplying portion and the separation gas supplying portion, and an inert gas is supplied from the second gas supplying portion.

8. The method of depositing the film according to claim 7, wherein the first predetermined number of turns is greater than the second predetermined number of turns, and the first nitride film is deposited to be thicker than the second nitride film.

9. The method of depositing the film according to claim 7, wherein the first and second elements are a metal element or a semiconductor element.

10. The method of depositing the film according to claim 9, wherein the metal element is any one of Hf, Zr, Al, Ti, and Sr, and the semiconductor element is Si.

* * * * *